US012701974B2

(12) United States Patent
Tsai et al.

(10) Patent No.: US 12,701,974 B2
(45) Date of Patent: Aug. 4, 2026

(54) METHODS FOR ISOLATION PROCESS CONTROL AND STRUCTURES THEREOF

(71) Applicant: Taiwan Semiconductor Manufacturing Company LTD, Hsinchu (TW)

(72) Inventors: Wei Che Tsai, Pingtung City (TW); Yuan Tsung Tsai, Tainan City (TW); Hsin-Yi Tsai, Tainan (TW); Ying Ming Wang, Tainan City (TW); Hsien Hua Tseng, Tainan City (TW); Shih-Hao Chen, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 437 days.

(21) Appl. No.: 18/205,001

(22) Filed: Jun. 2, 2023

(65) Prior Publication Data

US 2024/0404871 A1 Dec. 5, 2024

(51) Int. Cl.
H10W 10/00 (2026.01)
H10D 84/83 (2025.01)
H10P 50/00 (2026.01)
H10W 10/17 (2026.01)

(52) U.S. Cl.
CPC .......... H10W 10/014 (2026.01); H10D 84/83 (2025.01); H10P 50/695 (2026.01); H10W 10/17 (2026.01)

(58) Field of Classification Search
CPC .......... H01L 21/76224; H01L 21/3086; H10D 84/0151; H10W 10/014; H10W 10/17; H10P 50/695
See application file for complete search history.

(56) References Cited

U.S. PATENT DOCUMENTS

| | | | |
|---|---|---|---|
| 9,595,613 B1 * | 3/2017 | Cheng | H10D 64/693 |
| 9,911,604 B1 * | 3/2018 | Sun | H01L 21/31144 |
| 10,276,676 B1 * | 4/2019 | Liang | H10D 30/6217 |

(Continued)

FOREIGN PATENT DOCUMENTS

TW 202137488 A 10/2021

OTHER PUBLICATIONS

The Taiwan Patent Office—Office Action, Dated: Sep. 2, 2024, Application No. 11320875260.

*Primary Examiner* — Bac H Au

(74) *Attorney, Agent, or Firm* — Lippes Mathias LLP

(57) ABSTRACT

Methods for forming a dielectric isolation region between two active regions are disclosed herein. A mandrel is formed on a substrate, then etched to form a trench. Spacers are formed on the sidewalls of the mandrel. The mandrel is removed, and the substrate is etched to form fins extending in a first direction in the two active regions, and of fins extending in a second direction. A mask is formed that exposes the substrate between the fins extending in the second direction. The substrate is etched to form a trench. The trench is filled with a dielectric material up to the top of the fins to form the dielectric isolation region. The methods provide better depth control during etching between the two active regions, and also permit the trench to extend deeper into the substrate due to reduced depth/width ratios during the etching steps.

20 Claims, 29 Drawing Sheets

(56)  References Cited

U.S. PATENT DOCUMENTS

| | | | | |
|---|---|---|---|---|
| 2013/0273711 A1* | 10/2013 | Liu | ................... | H01L 21/76224 |
| | | | | 257/E21.546 |
| 2014/0051247 A1* | 2/2014 | Cheng | ................. | H01L 21/0337 |
| | | | | 438/689 |
| 2015/0108551 A1* | 4/2015 | Shieh | ................... | H10D 84/834 |
| | | | | 438/424 |
| 2015/0111362 A1* | 4/2015 | Shieh | ................. | H10D 84/0158 |
| | | | | 438/424 |
| 2018/0090335 A1* | 3/2018 | Karve | ................. | H01L 21/3086 |
| 2018/0211866 A1* | 7/2018 | Cheng | ..................... | H01L 22/26 |
| 2020/0152464 A1* | 5/2020 | Tseng | ................. | H01L 21/3086 |
| 2020/0234966 A1* | 7/2020 | Chang | ................. | H01L 21/3086 |
| 2021/0296304 A1 | 9/2021 | Liaw | | |
| 2024/0404871 A1* | 12/2024 | Tsai | ................... | H01L 21/3086 |

* cited by examiner

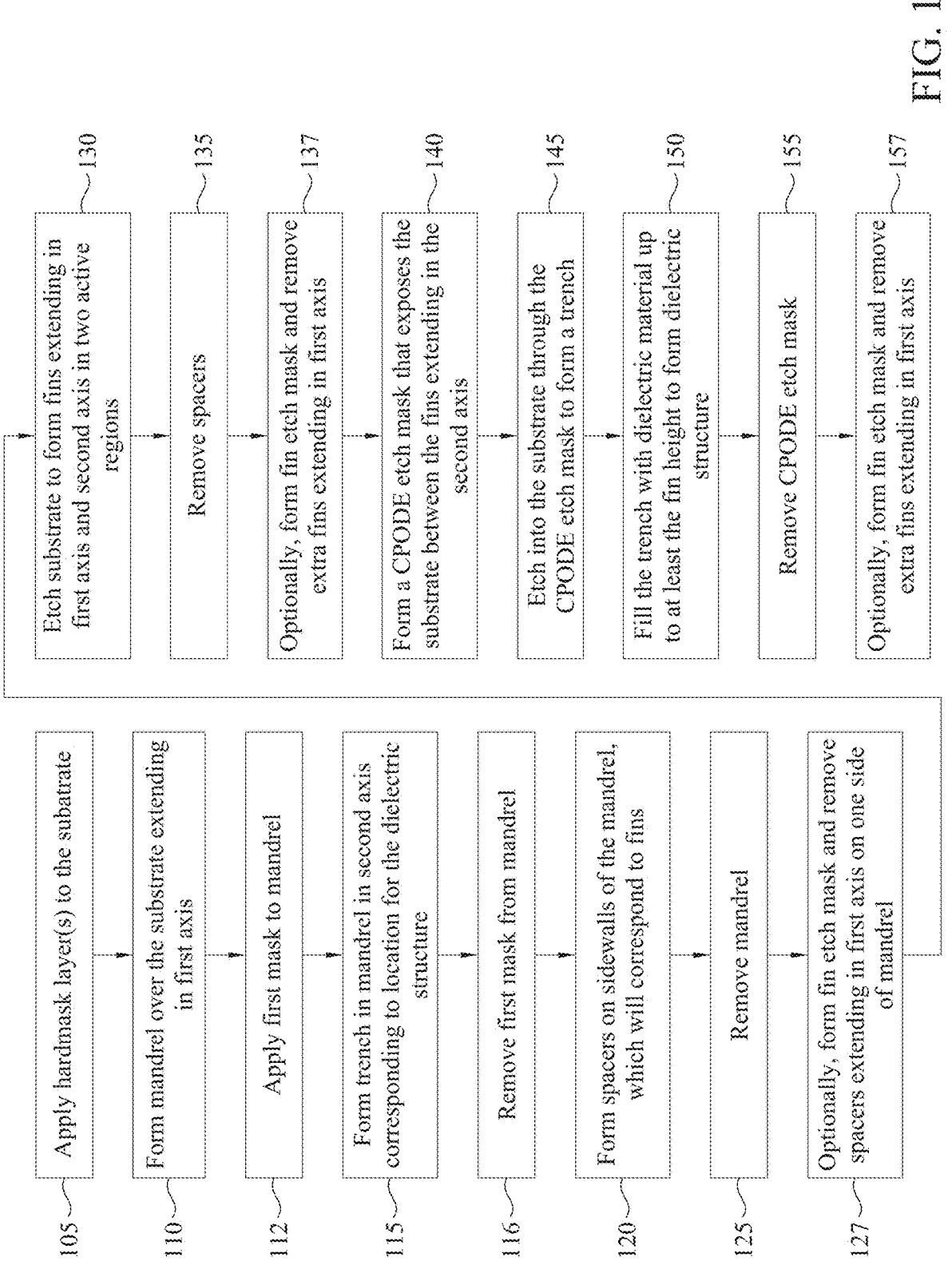

105 — Apply hardmask layer(s) to the substrate

110 — Form mandrel over the substrate extending in first axis

112 — Apply first mask to mandrel

115 — Form trench in mandrel in second axis corresponding to location for the dielectric structure 116 — Remove first mask from mandrel 120 — Form spacers on sidewalls of the mandrel, which will correspond to fins 125 — Remove mandrel 127 — Optionally, form fin etch mask and remove spacers extending in first axis on one side of mandrel 130 — Etch substrate to form fins extending in first axis and second axis in two active regions 135 — Remove spacers 137 — Optionally, form fin etch mask and remove extra fins extending in first axis 140 — Form a CPODE etch mask that exposes the substrate between the fins extending in the second axis 145 — Etch into the substrate through the CPODE etch mask to form a trench 150 — Fill the trench with dielectric material up to at least the fin height to form dielectric structure 155 — Remove CPODE etch mask 157 — Optionally, form fin etch mask and remove extra fins extending in first axis

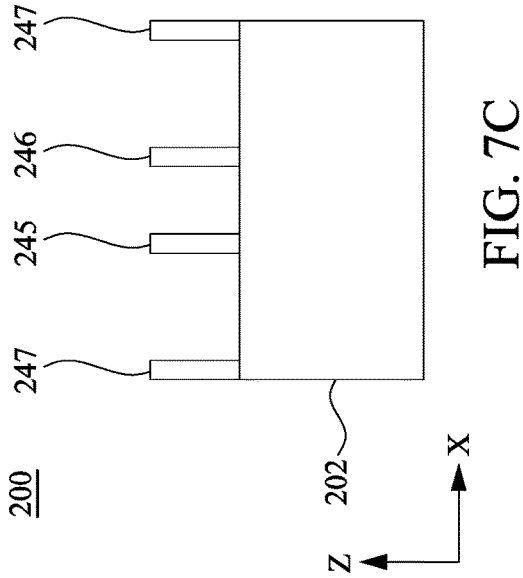
FIG. 7C
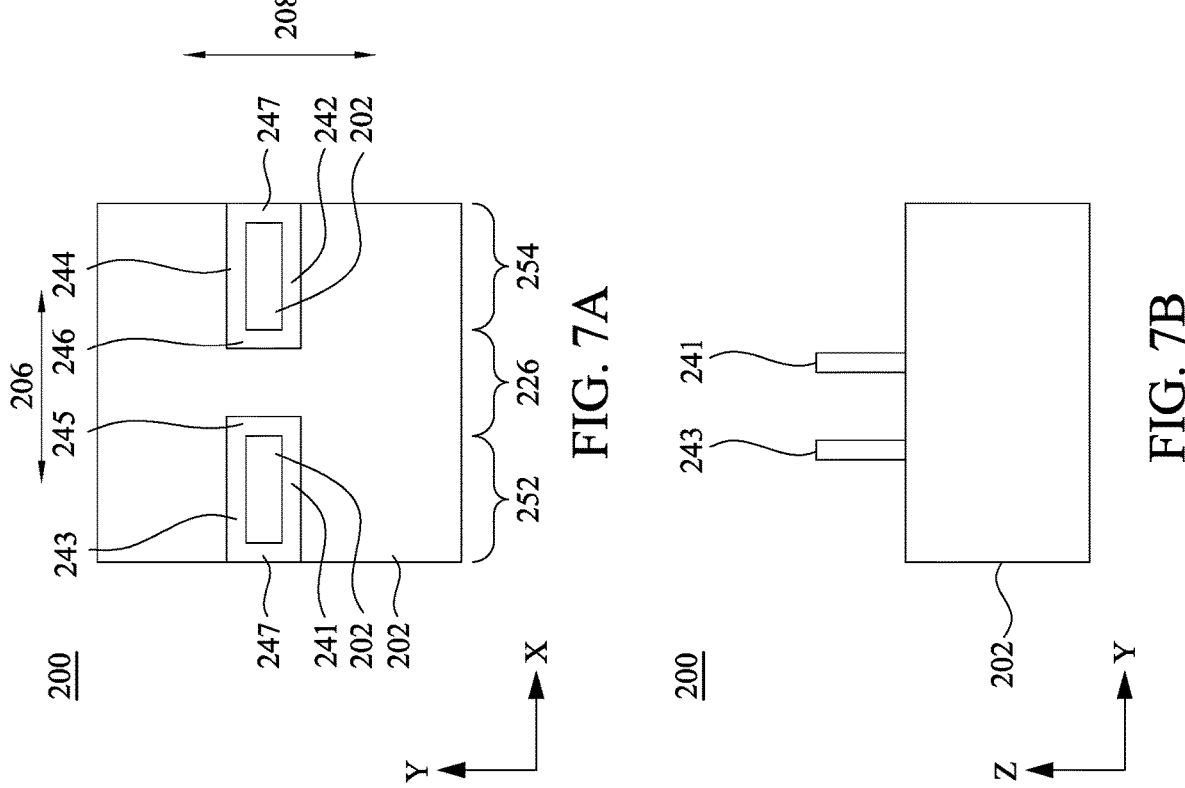
FIG. 7A
FIG. 7B

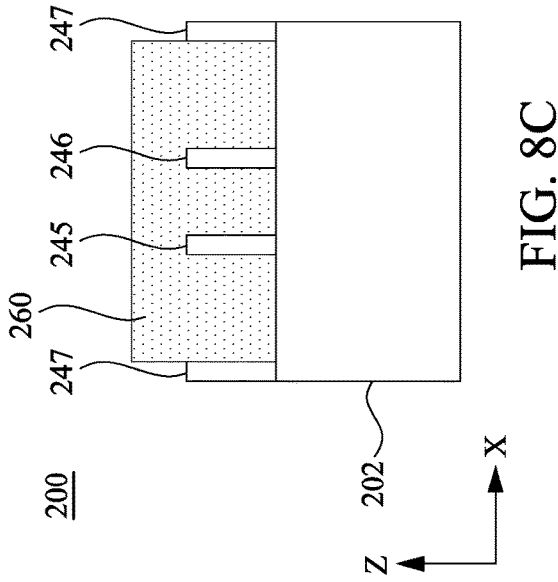
FIG. 8C
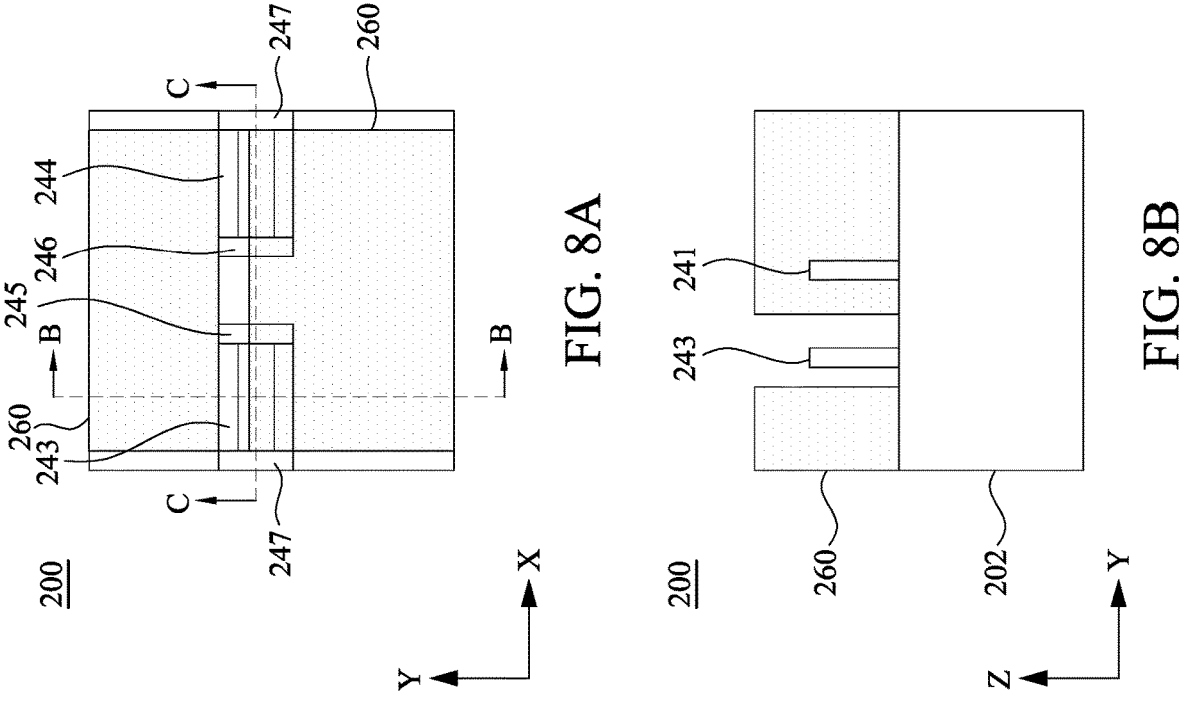
FIG. 8A
FIG. 8B

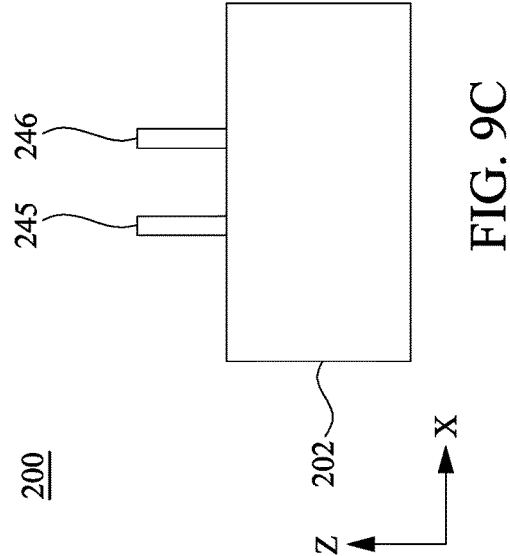
FIG. 9C
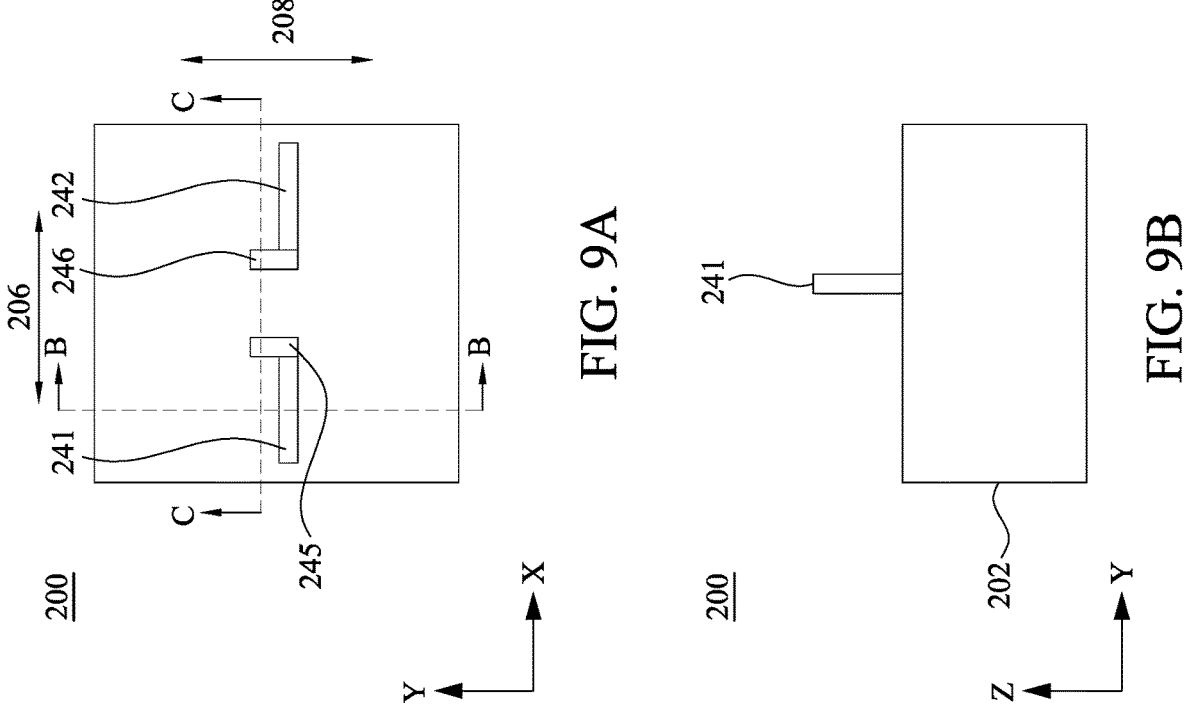
FIG. 9A
FIG. 9B

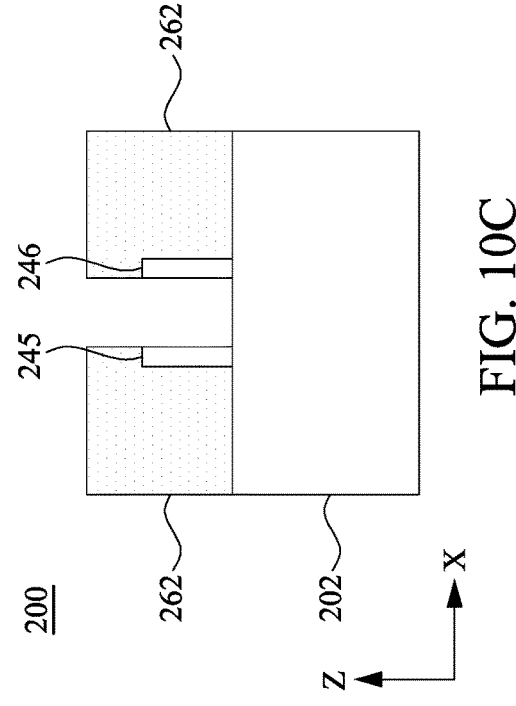
FIG. 10C
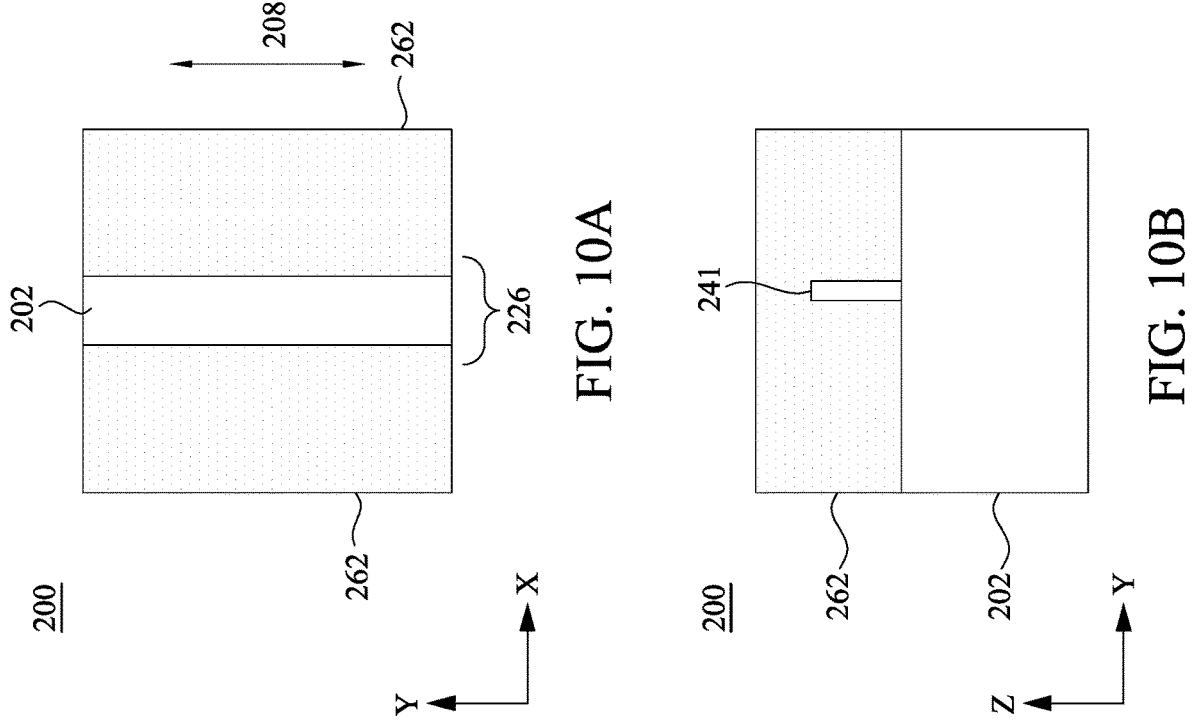
FIG. 10A
FIG. 10B

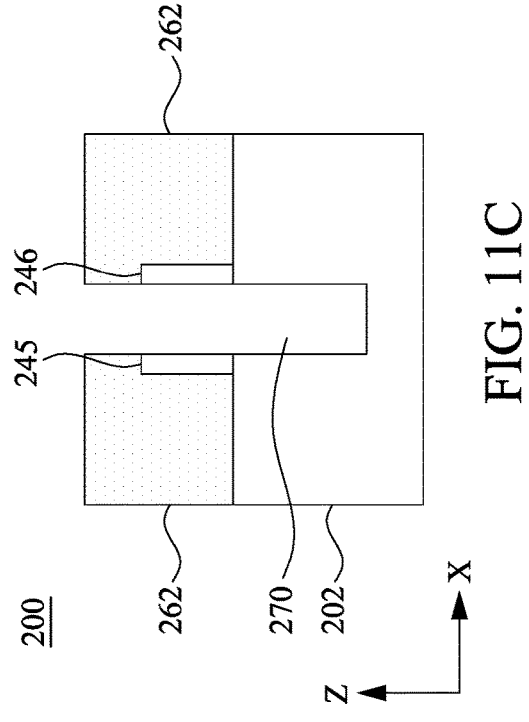
FIG. 11C
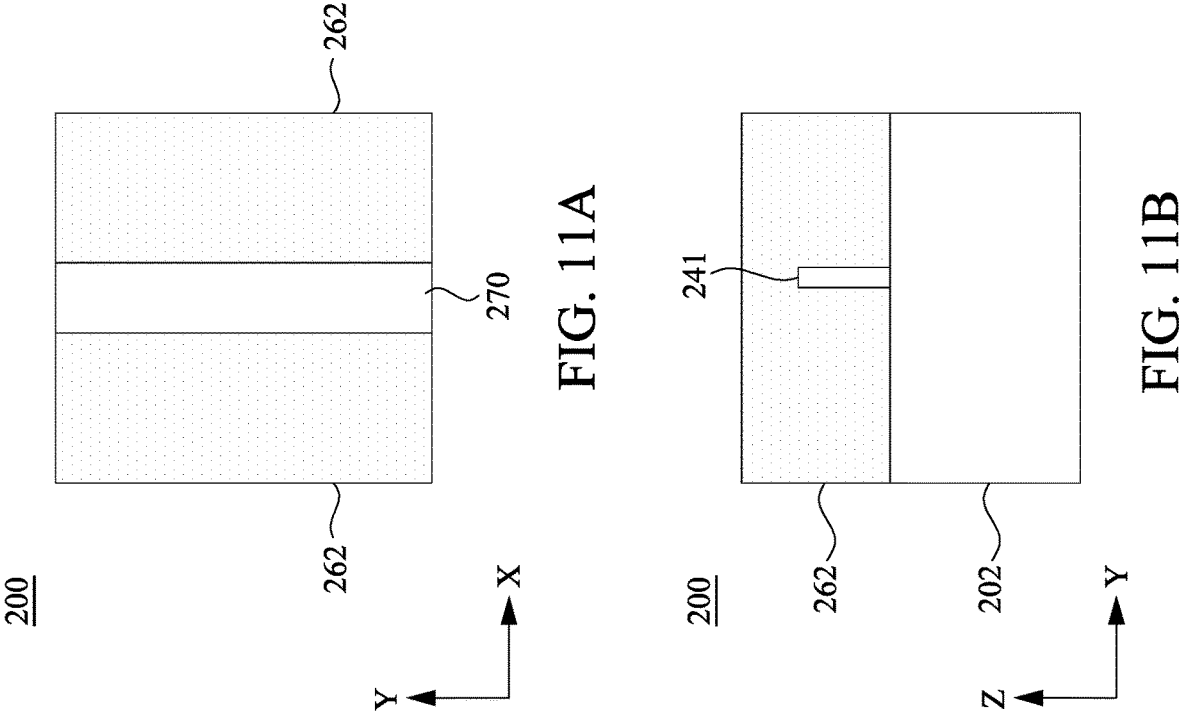
FIG. 11A
FIG. 11B

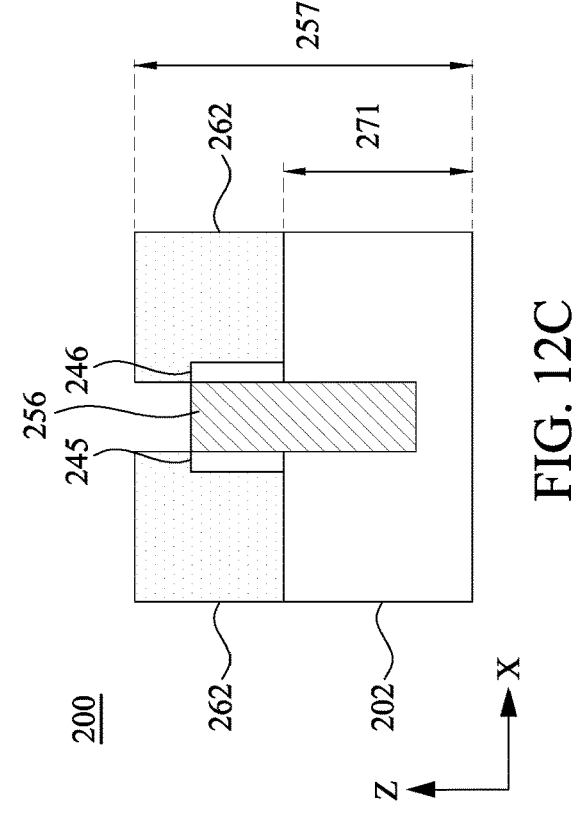
FIG. 12C
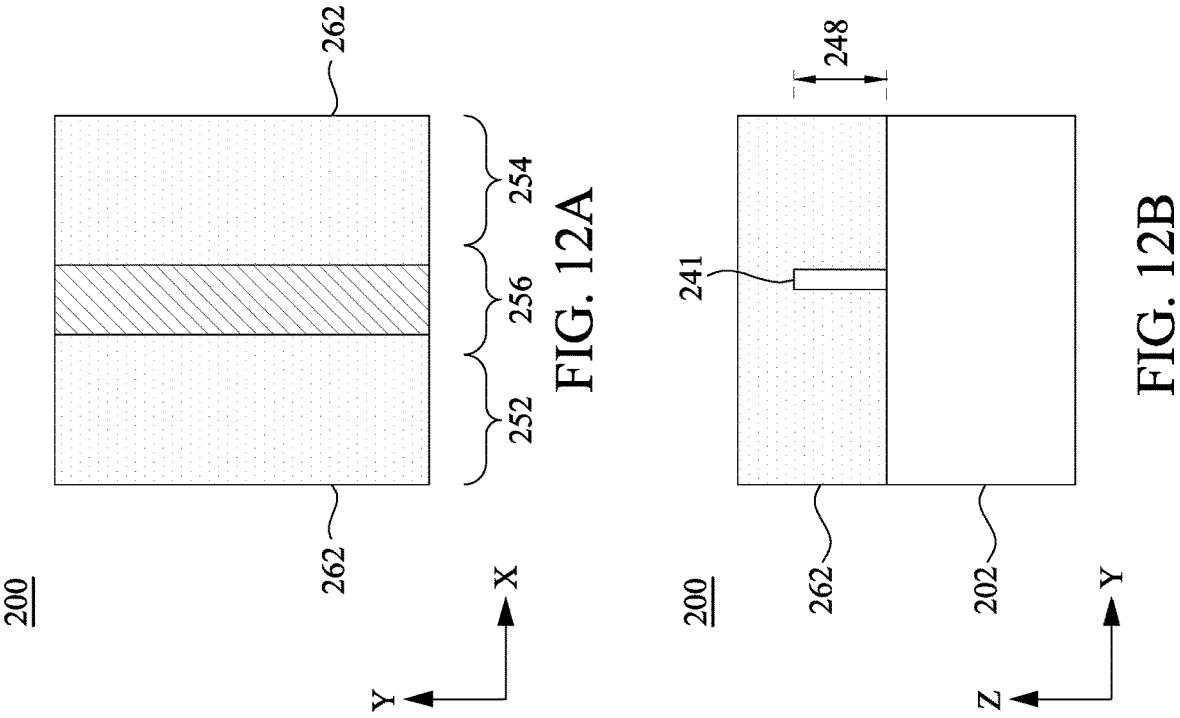
FIG. 12A
FIG. 12B

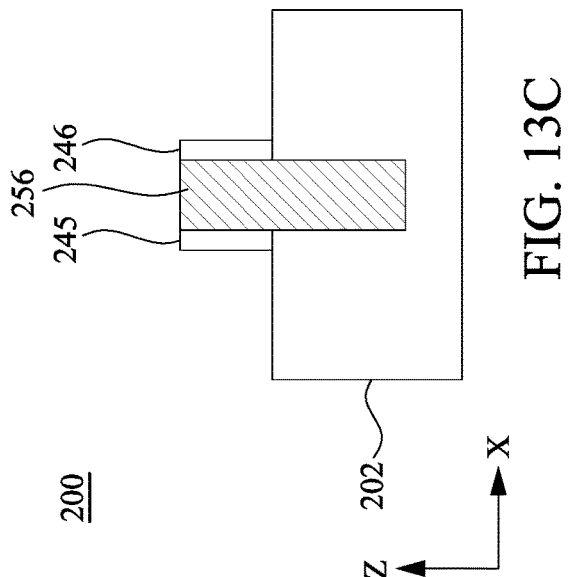
FIG. 13C
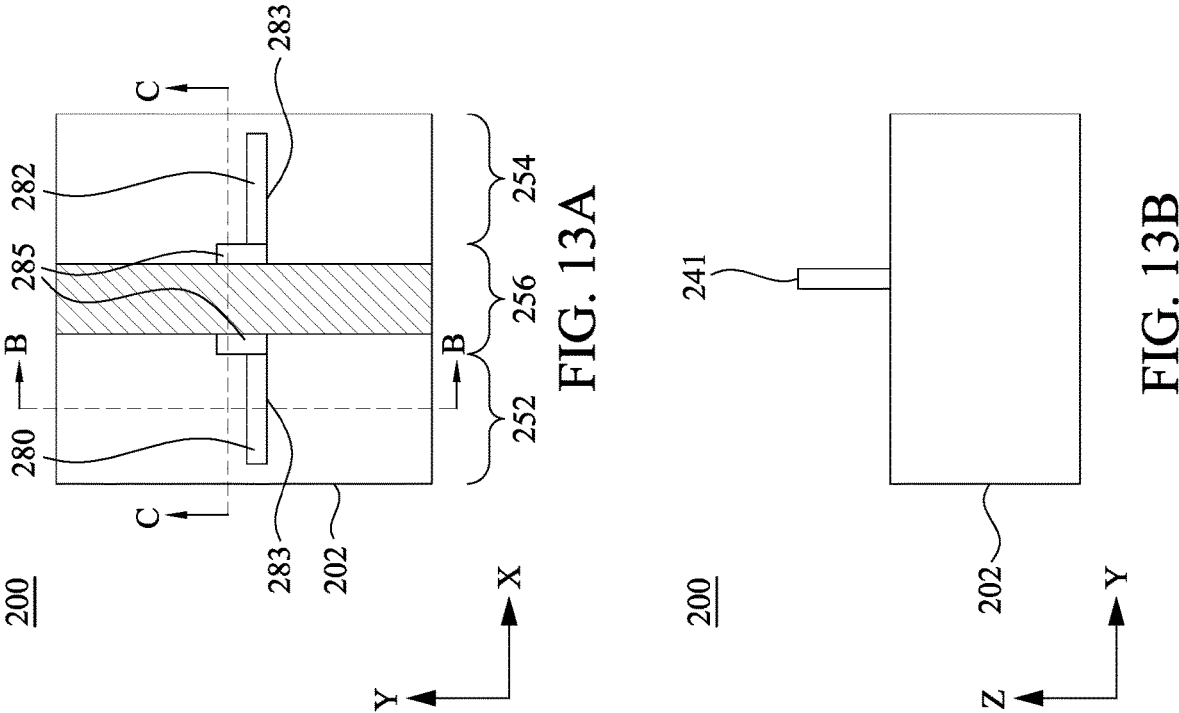
FIG. 13A
FIG. 13B

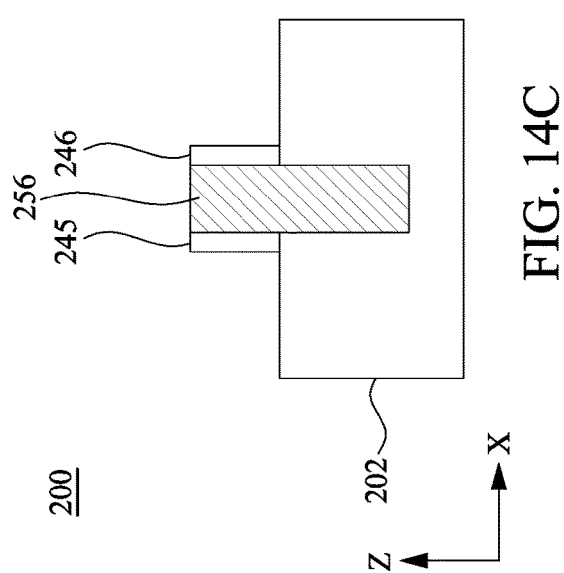
FIG. 14C
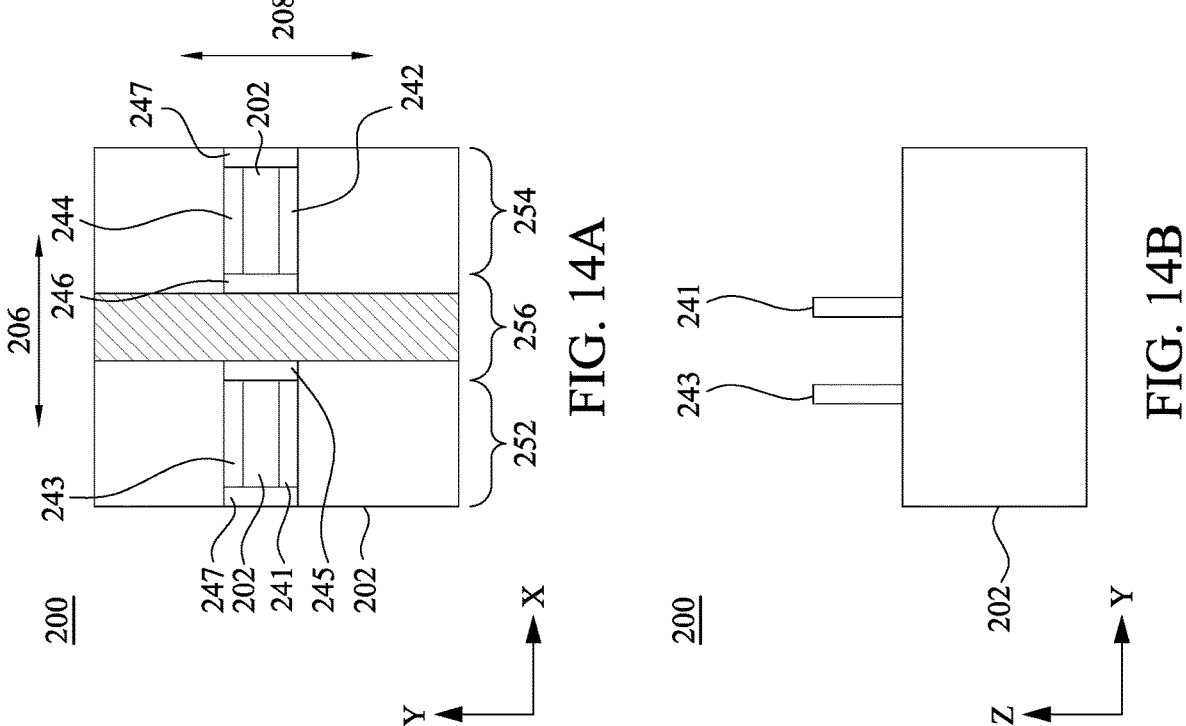
FIG. 14A
FIG. 14B

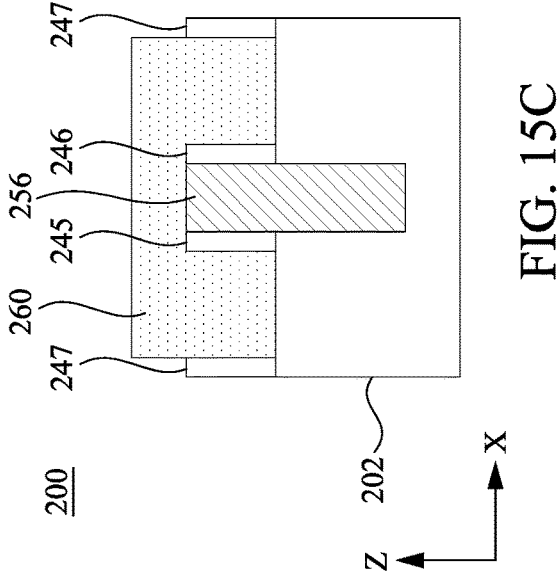
FIG. 15C
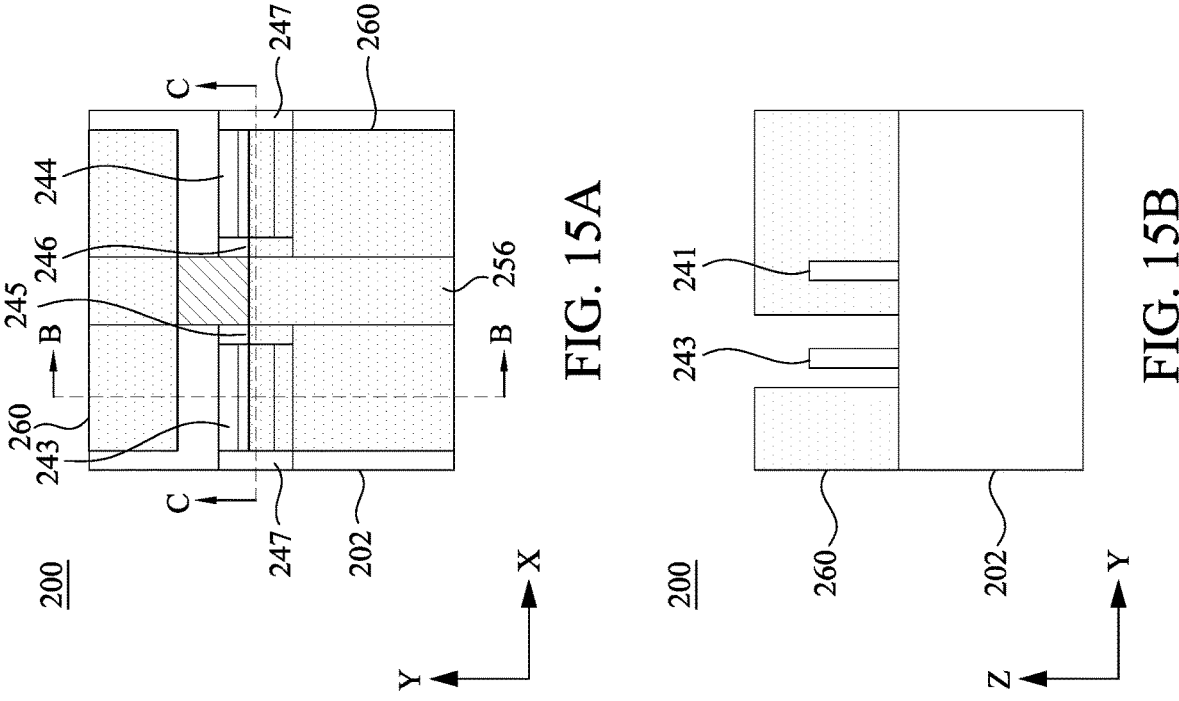
FIG. 15A
FIG. 15B

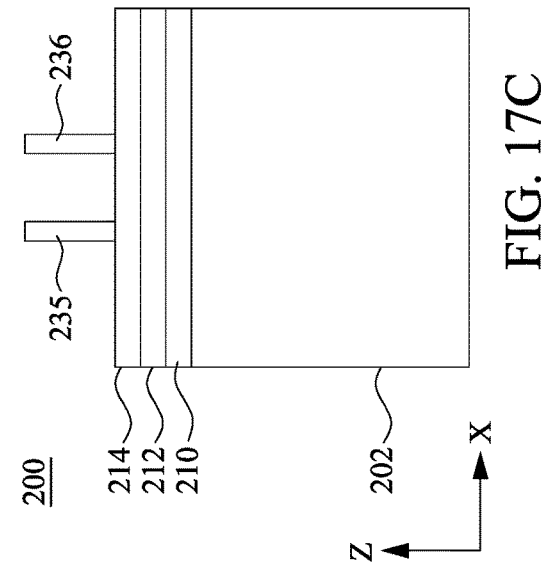
FIG. 17C
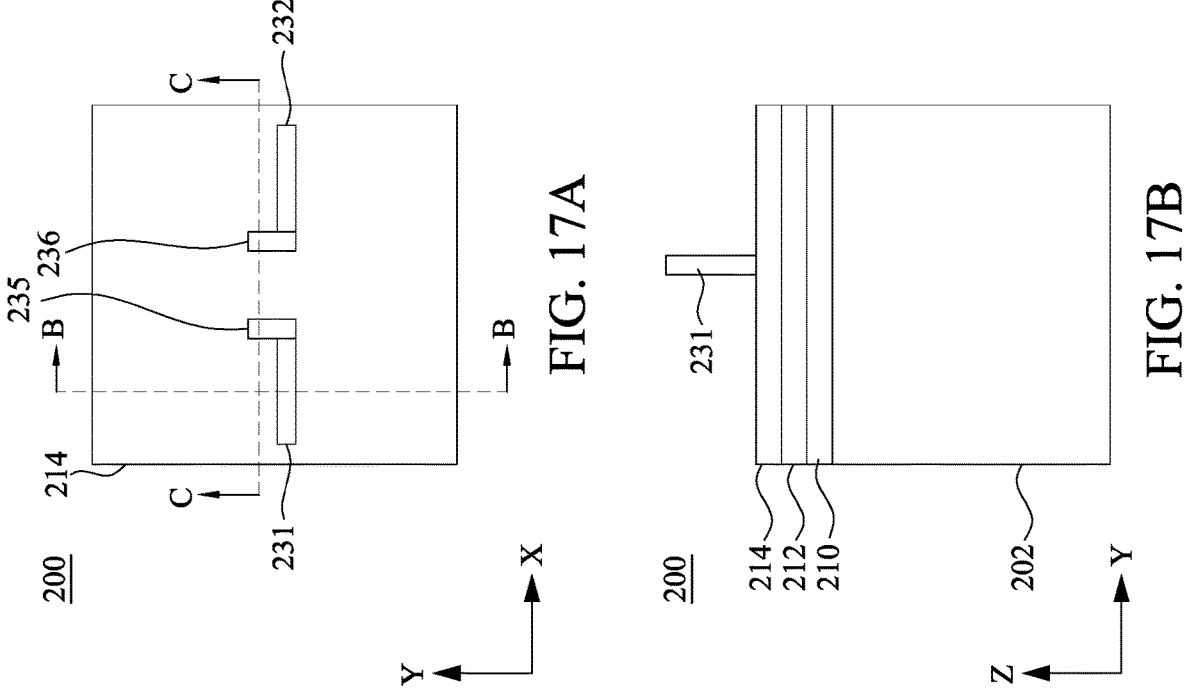
FIG. 17A
FIG. 17B

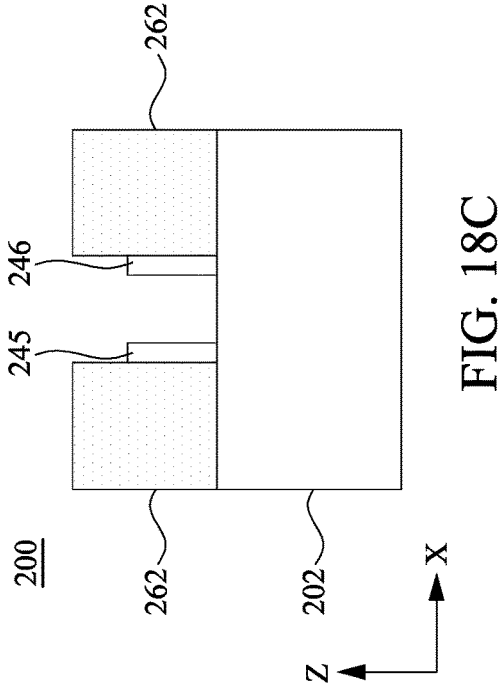
FIG. 18C
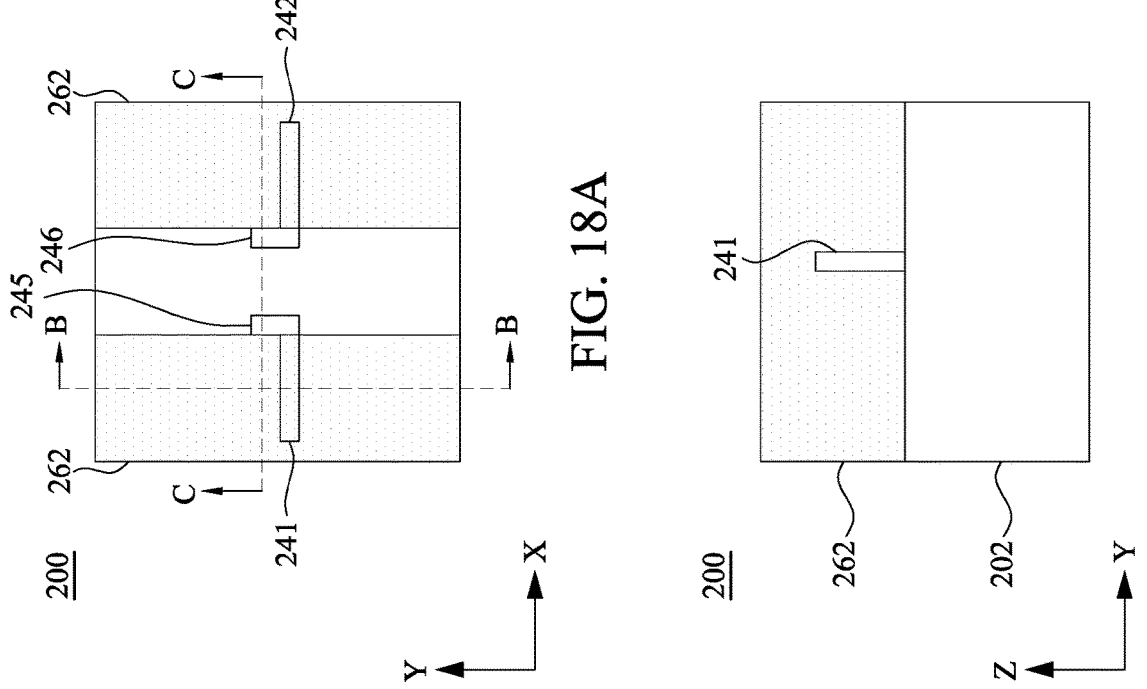
FIG. 18A
FIG. 18B

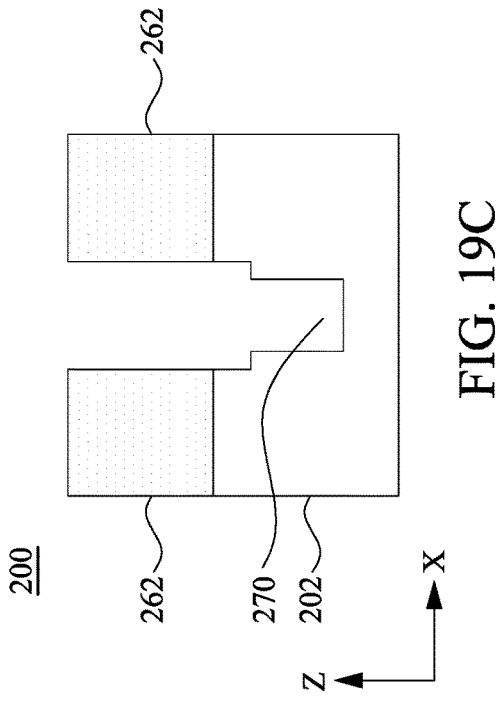
FIG. 19C
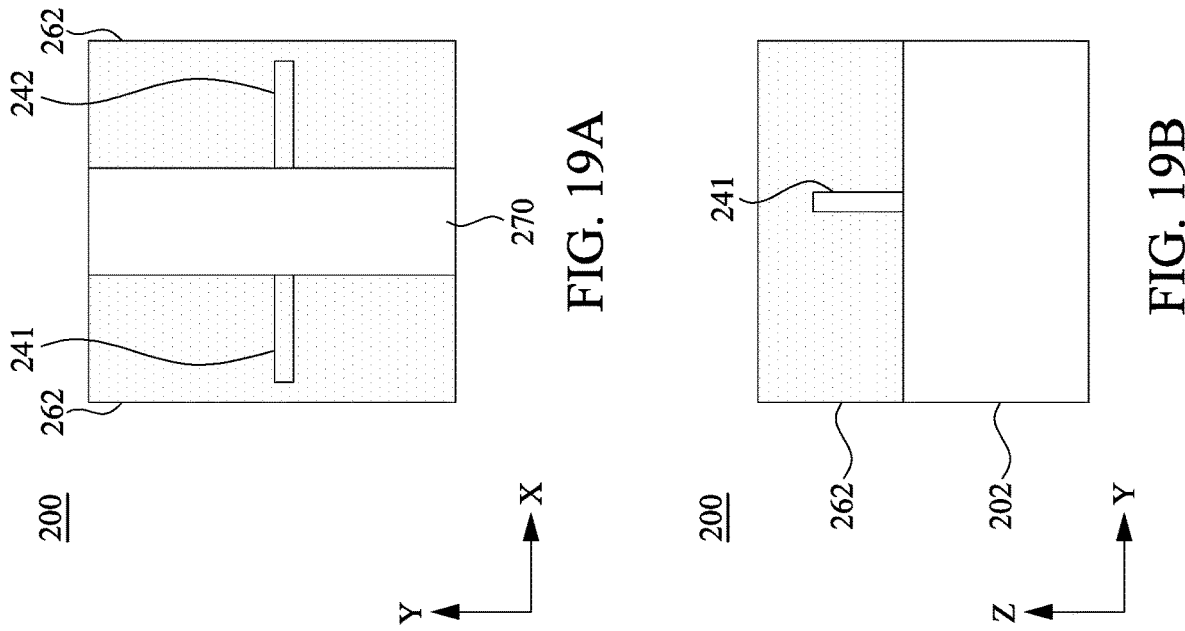
FIG. 19A
FIG. 19B

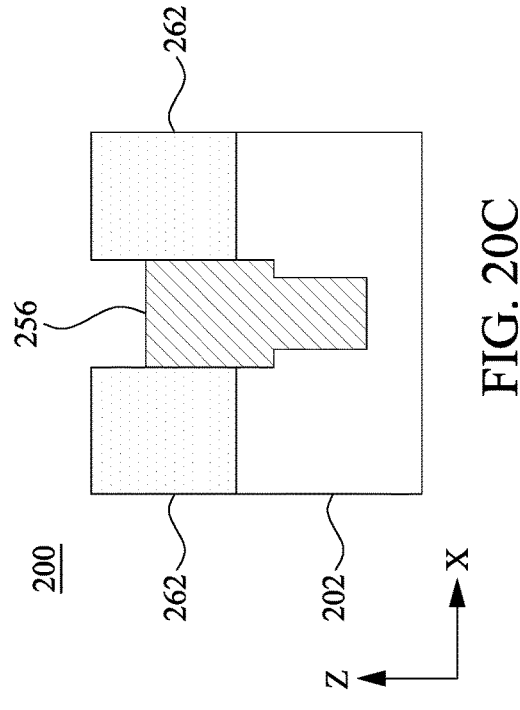
FIG. 20C
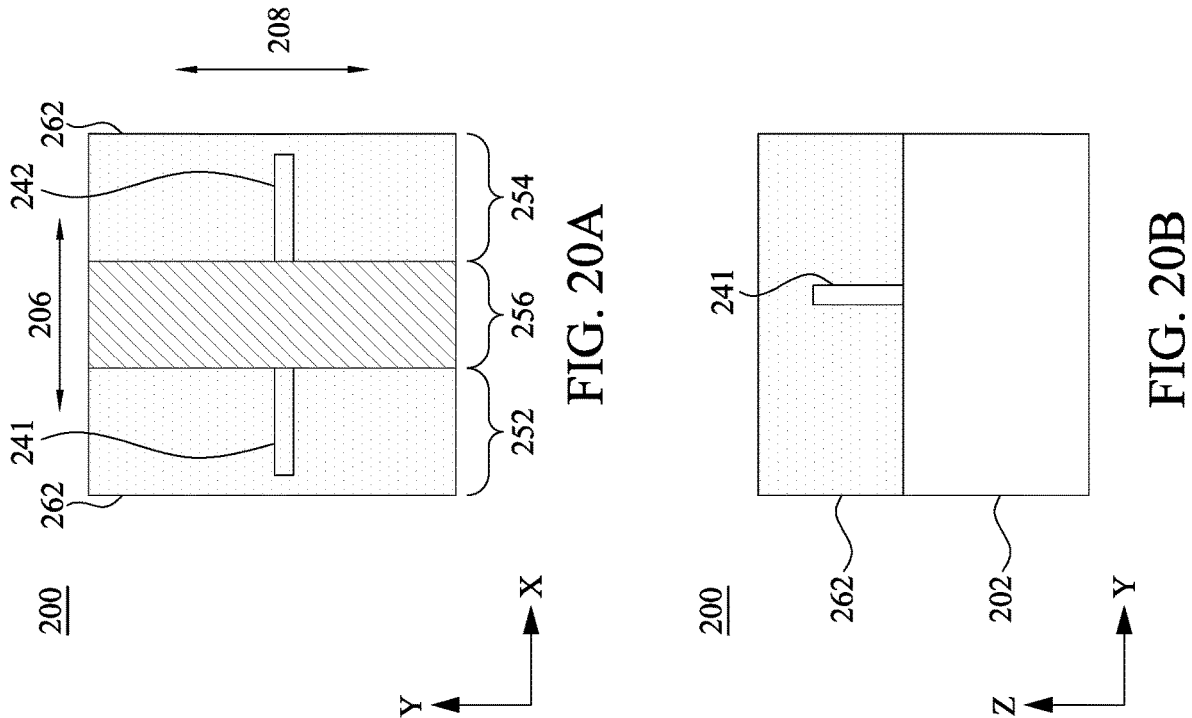
FIG. 20A
FIG. 20B

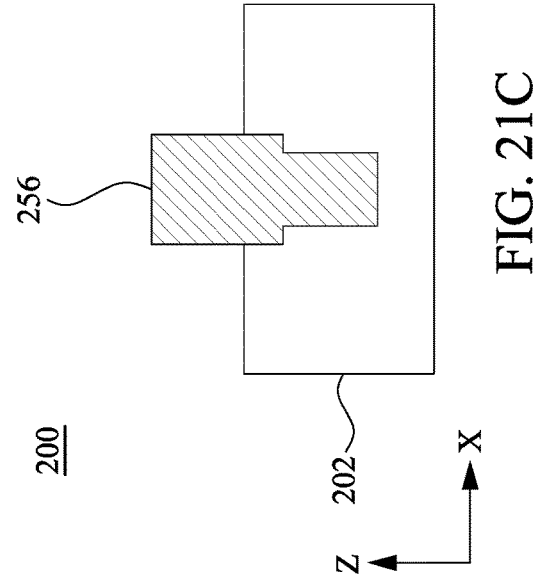
FIG. 21C
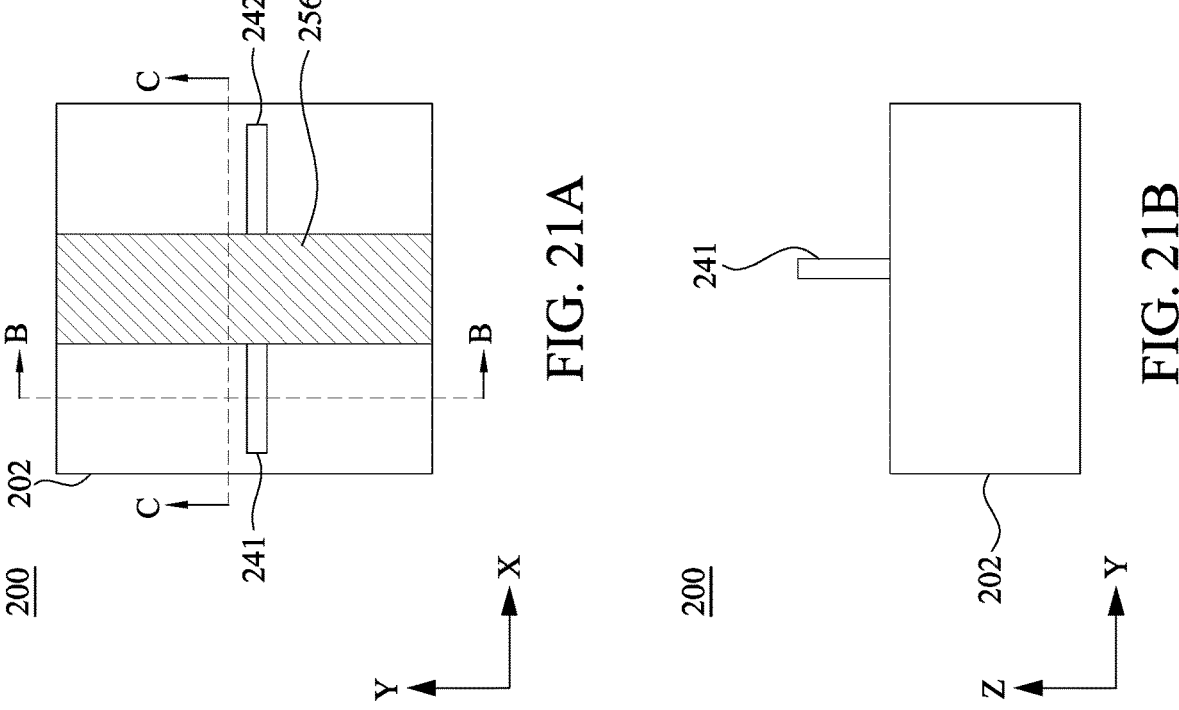
FIG. 21A
FIG. 21B

METHODS FOR ISOLATION PROCESS CONTROL AND STRUCTURES THEREOF

BACKGROUND

Integrated circuits are formed on a semiconductor wafer. Photolithographic patterning processes use ultraviolet light to transfer a desired mask pattern to a photoresist on a semiconductor wafer. Etching processes may then be used to transfer to the pattern to a layer below the photoresist. This process is repeated multiple times with different patterns to build different layers on the wafer substrate and make a useful device.

However, traditional photolithographic processes can no longer meet the requirements for critical dimension (CD) and pattern density in integrated circuits, such as 10 nanometers (nm) or smaller. Frequently, mandrel-spacer techniques are used in advanced photolithography to reduce the pitch of a final pattern to one half of the original mask pattern.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart illustrating a method for forming a dielectric structure between two active regions, in accordance with some embodiments. This is done by etching the mandrel and then the substrate in two separate process steps, rather than etching through the fin and the substrate in one process step.

FIG. 2A is a plan view. FIG. 2B is an X-axis view through line B-B. FIG. 2C is a Y-axis view through line C-C.

FIG. 3A is a plan view. FIG. 3B is an X-axis view. FIG. 3C is a Y-axis view.

FIG. 4A is a plan view. FIG. 4B is an X-axis view. FIG. 4C is a Y-axis view.

FIG. 5A is a plan view. FIG. 5B is an X-axis view. FIG. 5C is a Y-axis view.

FIG. 6A is a plan view. FIG. 6B is an X-axis view. FIG. 6C is a Y-axis view.

FIGS. 7A-7C are different views of a processing step. FIG. 7A is a plan view. FIG. 7B is an X-axis view. FIG. 7C is a Y-axis view.

FIGS. 8A-8C are different views of a processing step. FIG. 8A is a plan view. FIG. 8B is an X-axis view. FIG. 8C is a Y-axis view.

FIGS. 9A-9C are different views of a processing step. FIG. 9A is a plan view. FIG. 9B is an X-axis view. FIG. 9C is a Y-axis view.

FIGS. 10A-10C are different views of a processing step. FIG. 10A is a plan view. FIG. 10B is an X-axis view. FIG. 10C is a Y-axis view.

FIGS. 11A-11C are different views of a processing step. FIG. 11A is a plan view. FIG. 11B is an X-axis view. FIG. 11C is a Y-axis view.

FIGS. 12A-12C are different views of a processing step. FIG. 12A is a plan view. FIG. 12B is an X-axis view. FIG. 12C is a Y-axis view.

FIGS. 13A-13C are different views of a processing step. FIG. 13A is a plan view. FIG. 13B is an X-axis view. FIG. 13C is a Y-axis view.

FIGS. 14A-14C are different views of a processing step in a first variation of the methods of FIG. 1. FIG. 14A is a plan view. FIG. 14B is an X-axis view. FIG. 14C is a Y-axis view.

FIGS. 15A-15C are different views of a processing step in the first variation. FIG. 15A is a plan view. FIG. 15B is an X-axis view. FIG. 15C is a Y-axis view.

FIG. 16A is a plan view. FIG. 16B is an X-axis view. FIG. 16C is a Y-axis view.

FIGS. 17A-17C are different views of a processing step in the second variation. FIG. 17A is a plan view. FIG. 17B is an X-axis view. FIG. 17C is a Y-axis view.

FIGS. 18A-18C are different views of a processing step in a third variation of the methods of FIG. 1. FIG. 18A is a plan view. FIG. 18B is an X-axis view. FIG. 18C is a Y-axis view.

FIGS. 19A-19C are different views of a processing step in the third variation. FIG. 19A is a plan view. FIG. 19B is an X-axis view. FIG. 19C is a Y-axis view.

FIGS. 20A-20C are different views of a processing step in the third variation. FIG. 20A is a plan view. FIG. 20B is an X-axis view. FIG. 20C is a Y-axis view.

FIGS. 21A-21C are different views showing the final structure of the third variation, in some embodiments. FIG. 21A is a plan view. FIG. 21B is an X-axis view. FIG. 21C is a Y-axis view.

DETAILED DESCRIPTION

Figure 2A:
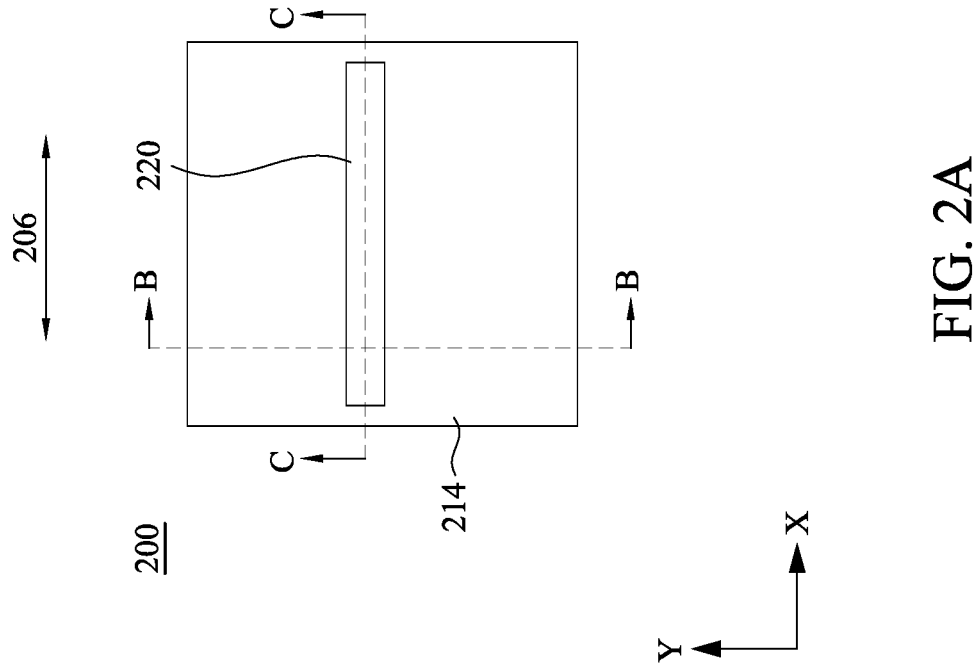
FIGS. 2A-2C are different views of a processing step.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Numerical values in the specification and claims of this application should be understood to include numerical values which are the same when reduced to the same number of significant figures and numerical values which differ from the stated value by less than the experimental error of conventional measurement technique of the type described in the present application to determine the value. All ranges disclosed herein are inclusive of the recited endpoint.

The term "about" can be used to include any numerical value that can vary without changing the basic function of that value. When used with a range, "about" also discloses the range defined by the absolute values of the two endpoints, e.g. "about 2 to about 4" also discloses the range "from 2 to 4." The term "about" may refer to plus or minus 10% of the indicated number.

The present disclosure relates to structures which are made up of different layers. When the terms "on" or "upon" or "over" are used with reference to two different layers (including the substrate), they indicate merely that one layer is on or upon the other layer. These terms do not require the two layers to directly contact each other, and permit other layers to be between the two layers. For example all layers of the structure can be considered to be "on" the substrate, even though they do not all directly contact the substrate. The term "directly" may be used to indicate two layers directly contact each other without any layers in between them.

The present disclosure relates to various methods for forming a continuous poly on diffusion edge (CPODE) structure. In this regard, a CPODE structure or pattern may be used as an electrically insulating or dielectric structure or feature on the wafer. This provides electrical isolation between neighboring active device regions, such as transistors. This may be useful for reducing parasitic capacitance between active device regions, which increases processing speed. A CPODE structure can also be used as a vertically-oriented capacitor.

The present disclosure uses mandrel-spacer techniques to form integrated circuit structures such as semiconductor devices or transistors. Such techniques include self-aligned double patterning (SADP), which reduces the pitch of the exposed pattern by half. The methods described herein reduce the depth/width ratio during etching, permitting better etching process control and more stable device isolation performance.

FIG. 1 is a flow chart illustrating a method 100 for forming a dielectric structure between two active regions, in accordance with some embodiments. Some steps of the method are also illustrated in FIGS. 2A-13C. These figures provide different views for better understanding. The figures having an A suffix, i.e. FIGS. 2A-13A, are plan views. The figures having a B suffix, i.e. FIGS. 2B-13B, are X-axis views taken along line B-B of FIG. 2A. The figures having a C suffix, i.e. FIGS. 2C-13C, are Y-axis views taken along line C-C of FIG. 2A. Lines B-B and C-C are periodically repeated throughout the figures for easier reference.

Figure 2C:
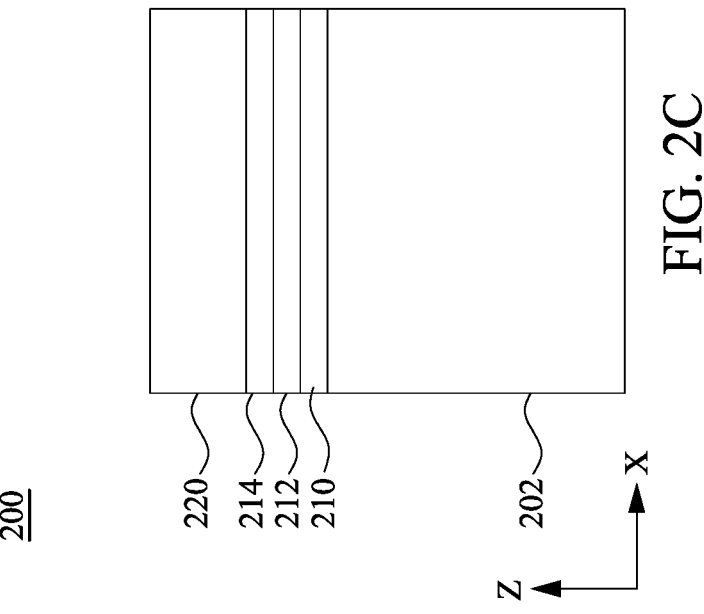
Figure 2B:
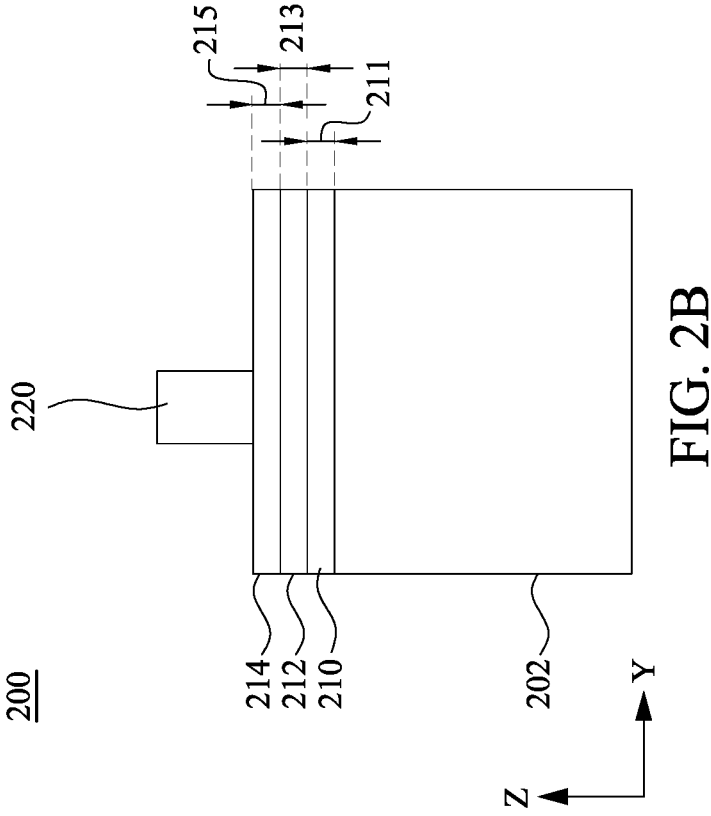

First, in step 105, one or more hardmask layers is/are applied to the substrate. This is typically performed by deposition of appropriate materials. Referring to FIGS. 2A-2C, these figures show the beginning state of the integrated circuit 200, before the CPODE structure is formed. The integrated circuit is built upon a substrate 202. The substrate is usually a wafer made of a semiconducting material. Such materials can include silicon, for example in the form of crystalline Si or polycrystalline Si. In alternative embodiments, the substrate can be made of other elementary semiconductors such as germanium, or may include a compound semiconductor such as silicon carbide (SiC), gallium arsenide (GaAs), gallium carbide, gallium phosphide, indium arsenide (InAs), indium phosphide (InP), silicon germanium, silicon germanium carbide, gallium arsenic phosphide, or gallium indium phosphide. In particular embodiments, the wafer substrate is silicon.

Here, three hardmask layers 210, 212, 214 are shown already deposited over the substrate 202. The first hardmask layer 210 directly contacting the substrate is a pad oxide layer. The oxide used to form the pad oxide layer can be, for example, a silicon oxide such as silicon dioxide ($SiO_2$), $AlO_x$, $HfO_x$, $ZrO_x$, or other suitable material. The pad oxide layer can be formed by thermal oxidation, PVD, CVD, ALD, oxidation, or other suitable deposition technique. In some non-limiting examples, the pad oxide layer 210 may have a thickness or depth 211 of from about 10 angstroms to about 30 angstroms, although other values and ranges are also within the scope of this disclosure.

The second hardmask layer 212 is a nitride layer that is deposited upon the pad oxide layer 210. The nitride used to form the nitride layer can be, for example, silicon nitride or silicon oxynitride. The nitride layer can be formed by PVD, CVD, ALD, oxidation, or other suitable deposition technique. In some particular embodiments, the nitride layer 212 may have a thickness or depth 213 of from about 100 angstroms to about 1000 angstroms, although other values and ranges are also within the scope of this disclosure.

Finally, the third hardmask layer 214 is a capping oxide layer that is deposited upon the nitride layer 212. The capping oxide layer can also be formed, for example, a silicon oxide such as silicon dioxide ($SiO_2$), $AlO_x$, $HfO_x$, $ZrO_x$, or other suitable material. Again, the capping oxide layer can be formed by thermal oxidation, PVD, CVD, ALD, oxidation, or other suitable deposition technique. In some particular embodiments, the capping oxide layer 214 may have a thickness or depth 215 of from about 100 angstroms to about 1000 angstroms, although other values and ranges are also within the scope of this disclosure. Together, the pad oxide layer 210, the nitride layer 212, and the capping oxide layer 214 form a tri-layer patterning etch system, which allows for better control of subsequent etching steps.

Next, referring to both step 110 of FIG. 1 and FIGS. 2A-2C together, one or more mandrels 220 is/are formed over the substrate 202. Each mandrel generally has a linear shape and extends in the direction of a first axis 206. Here, only one mandrel is illustrated for simplicity.

The mandrel can be formed by depositing a mandrel material layer, forming a photoresist layer upon the mandrel material layer, exposing the photoresist to radiation and developing the photoresist layer to form a mandrel pattern, and then etching the mandrel material layer to form the mandrel.

The material used to form the mandrel may be, for example, a dielectric material, for example a silicon oxide such as silicon dioxide ($SiO_2$), a nitride such as silicon nitride or silicon oxynitride, polysilicon, a high-k dielectric material, or a low-k dielectric material.

The photoresist layer may be applied, for example, by spin coating, or by spraying, roller coating, dip coating, or extrusion coating. Typically, in spin coating, the substrate is placed on a rotating platen, which may include a vacuum chuck that holds the substrate in plate. The photoresist composition is then applied to the center of the substrate.

The speed of the rotating platen is then increased to spread the resist evenly from the center of the substrate to the perimeter of the substrate. The rotating speed of the platen is then fixed, which can control the thickness of the final photoresist layer.

The photoresist layer may then be baked or cured to remove the solvent and harden the photoresist layer. In some particular embodiments, the baking occurs at a temperature of about 90° C. to about 110° C., although other values and ranges are also within the scope of this disclosure. The baking can be performed using a hot plate or oven, or similar equipment.

The photoresist layer is then patterned via exposure to radiation. The radiation may be any light wavelength which carries a desired mask pattern. In particular embodiments, EUV light having a wavelength of about 13.5 nm is used for patterning, as this permits smaller feature sizes to be obtained. This results in some portions of the photoresist layer being exposed to radiation, and some portions of the photoresist not being exposed to radiation. This exposure causes some portions of the photoresist to become soluble in the developer and other portions of the photoresist to remain insoluble in the developer.

An additional photoresist bake step (post exposure bake, or PEB) may occur after the exposure to radiation. For example, this may help in releasing acid leaving groups (ALGs) or other molecules that are significant in chemical amplification photoresist.

The photoresist layer is then developed using a developer. The developer may be an aqueous solution or an organic solution. The soluble portions of the photoresist layer are dissolved and washed away during the development step, leaving behind a photoresist pattern. One example of a common developer is aqueous tetramethylammonium hydroxide (TMAH). Other developers may include 2-heptanone, n-butyl acetate, isoamyl acetate, cyclohexanone, 5-methyl-2-hexanone, methyl-2-hydroxyisobutyrate, ethyl lactate or propylene glycol monomethyl ether acetate, n-pentyl acetate, n-butyl propionate, n-hexyl acetate, n-butyl butyrate, isobutyl butyrate, 2,5-dimethyl-4-hexanone, 2,6-dimethyl-4-heptanone, propyl isobutyrate, or isobutyl propionate. Generally, any suitable developer may be used. Sometimes, a post develop bake or "hard bake" may be performed to stabilize the photoresist pattern after development, for optimum performance in subsequent steps.

Generally, any etching step used herein may be performed using wet etching, dry etching, or plasma etching processes such as reactive ion etching (RIE) or inductively coupled plasma (ICP), or combinations thereof, as appropriate. The etching may be anisotropic. Depending on the material, etchants may include carbon tetrafluoride ($CF_4$), hexafluoroethane ($C_2F_6$), octafluoropropane ($C_3F_8$), fluoroform ($CHF_3$), difluoromethane ($CH_2F_2$), fluoromethane ($CH_3F$), trifluoromethane ($CHF_3$), carbon fluorides, nitrogen ($N_2$), hydrogen ($H_2$), oxygen ($O_2$), argon (Ar), xenon (Xe), xenon difluoride ($XeF_2$), helium (He), carbon monoxide (CO), carbon dioxide ($CO_2$), fluorine ($F_2$), chlorine ($Cl_2$), oxygen ($O_2$), hydrogen bromide (HBr), hydrofluoric acid (HF), nitrogen trifluoride ($NF_3$), sulfur hexafluoride ($SF_6$), boron trichloride ($BCl_3$), ammonia ($NH_3$), bromine ($Br_2$), or the like, or combinations thereof in various ratios. For example, silicon dioxide can be wet etched using hydrofluoric acid and ammonium fluoride. Alternatively, silicon dioxide can be dry etched using various mixtures of $CHF_3$, $O_2$, $CF_4$, and/or $H_2$.

Figure 3A:
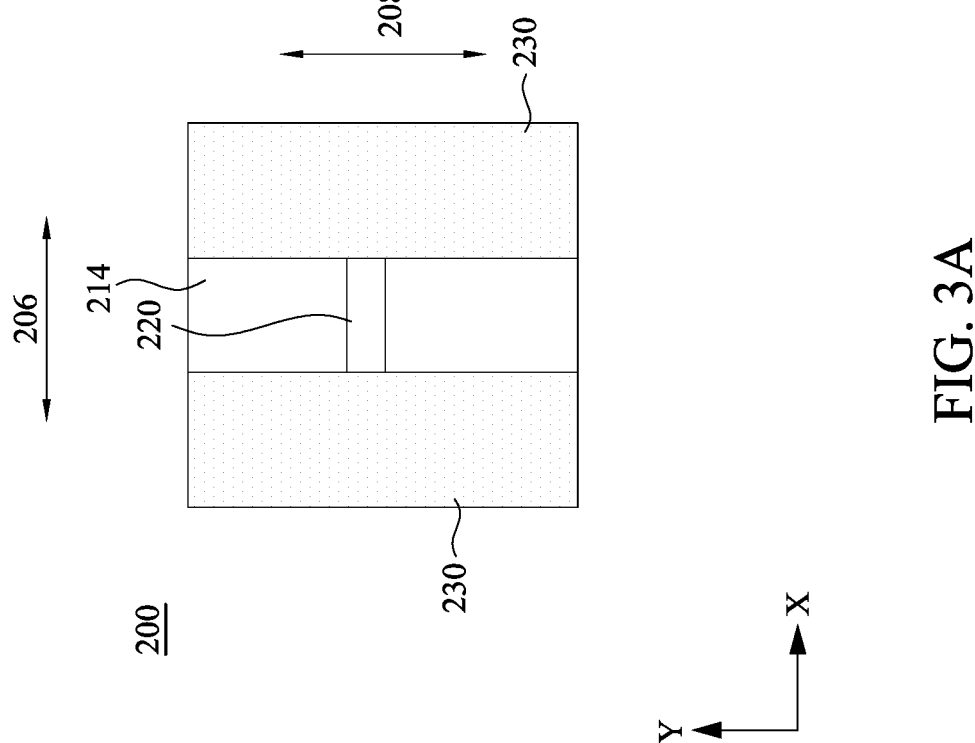
FIGS. 3A-3C are different views of a processing step.
Figure 3C:
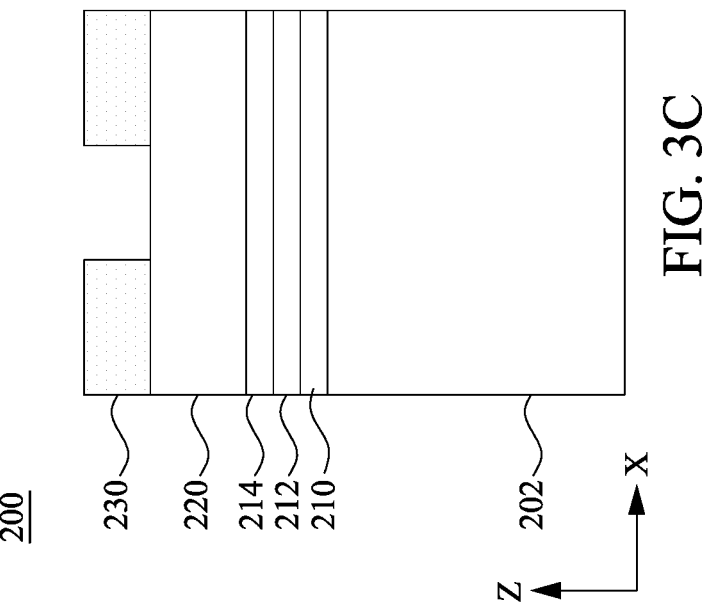
Figure 3B:
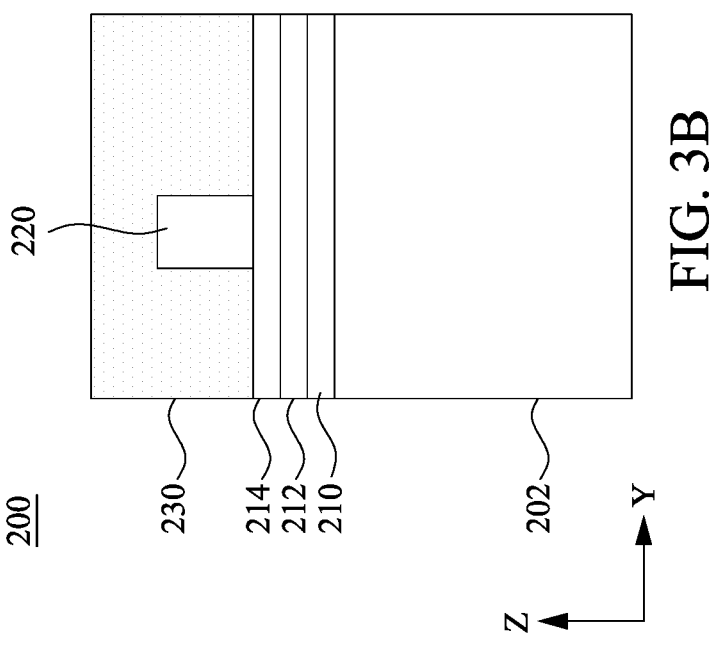

Next, in step 112 of FIG. 1, a first mask is applied over the mandrel(s). This may be done by applying and patterning another photoresist layer. The result of this step is shown in FIGS. 3A-3C. As can be seen here, the photoresist layer 230 is patterned so that a portion of the mandrel is exposed in a second axis 208 that is normal (i.e. substantially perpendicular) to the first axis 206. This portion of the mandrel corresponds to a desired location for the dielectric structure that will be formed. The rest of the mandrel is covered by the photoresist layer.

Figure 4A:
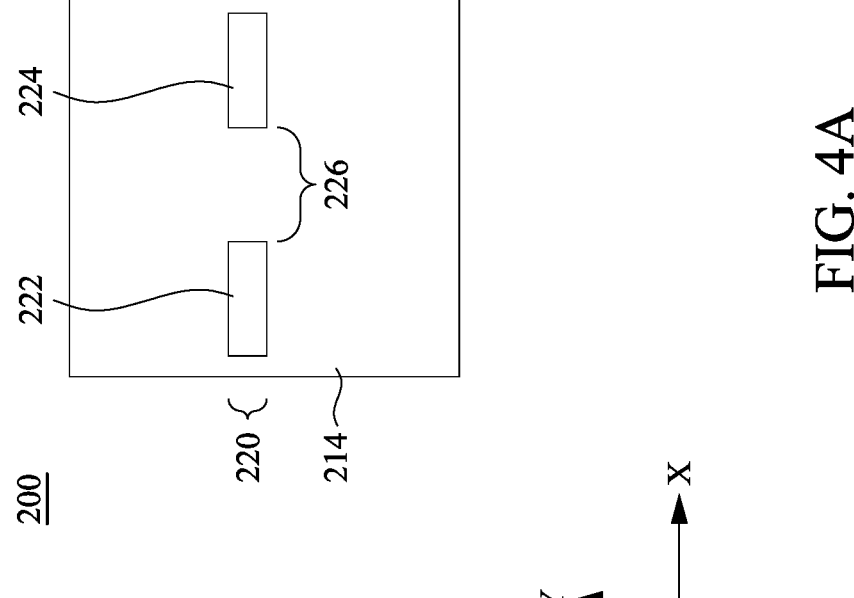
FIGS. 4A-4C are different views of a processing step.
Figure 4C:
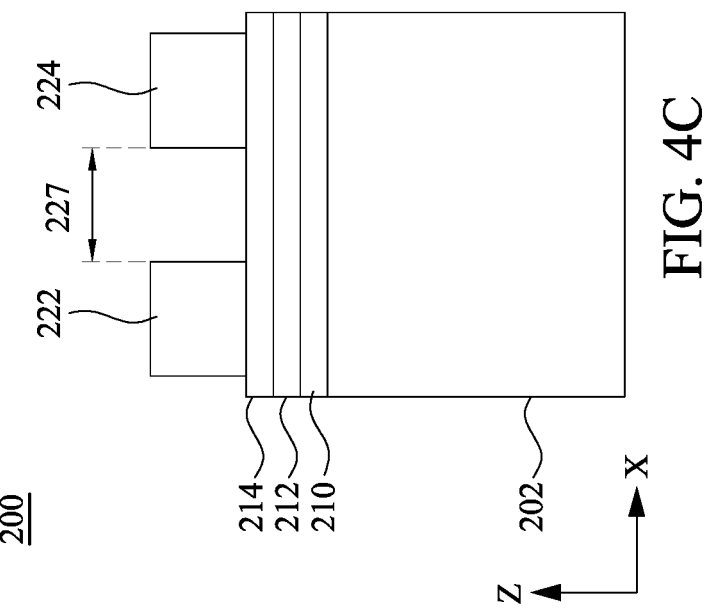
Figure 4B:
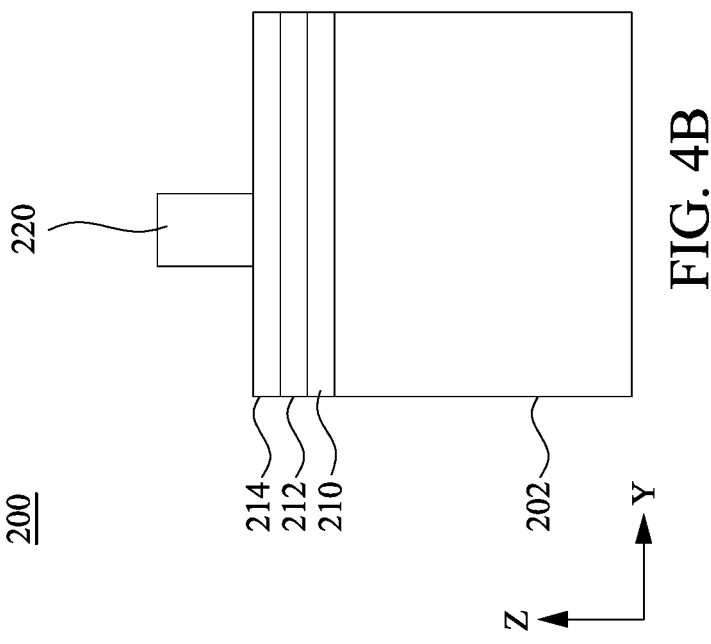

In step 115 of FIG. 1, the exposed portion of the mandrel is etched. The etching is performed all the way through to the third hardmask layer 208. In step 116, the first mask is removed. Photoresist can be removed, for example, using various solvents such as N-methyl-pyrrolidone (NMP) or alkaline media or other strippers at elevated temperatures, or by dry etching using oxygen plasma. The resulting structure is shown in FIGS. 4A-4C. As can be seen here, the mandrel 220 has now been divided into two portions 222, 224 which are separated by a mandrel trench 226. Referring to FIG. 4C, the width 227 of the mandrel trench, in some embodiments, may be about 30 nanometers to about 50 nanometers, although other values and ranges are also within the scope of this disclosure.

Next, in step 120 of FIG. 1, spacers are formed on the sidewalls of the mandrel 220. The spacers may be made from dielectric materials such as titanium nitride (TiN), silicon nitride (SiN), or titanium oxide. The spacers may be formed, for example, by deposition such as CVD or PVD, and then etching to remove horizontal material and leave only the sidewalls.

Figure 5A:
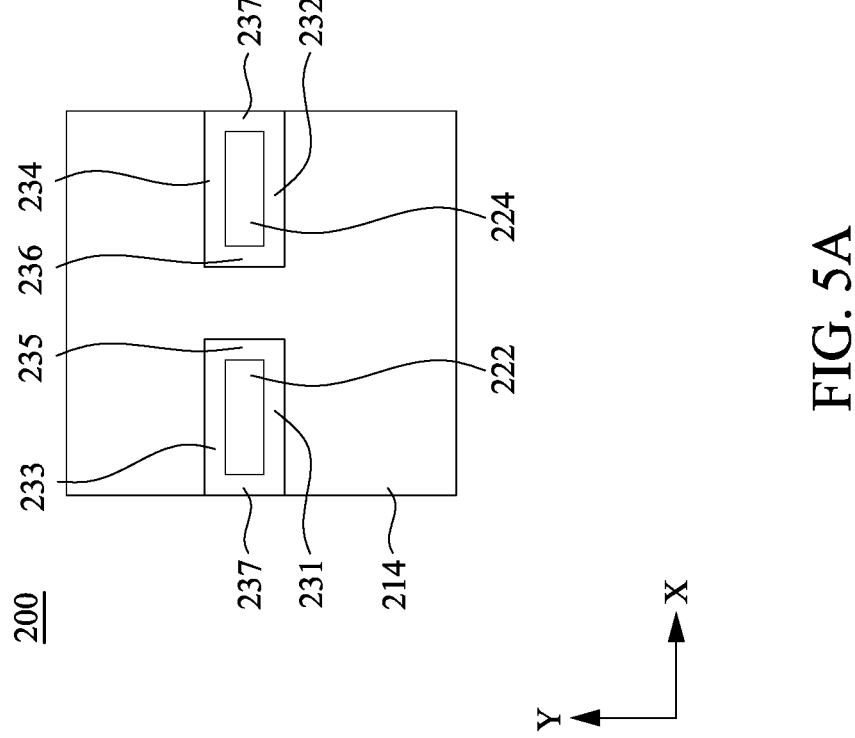
FIGS. 5A-5C are different views of a processing step.
Figure 5C:
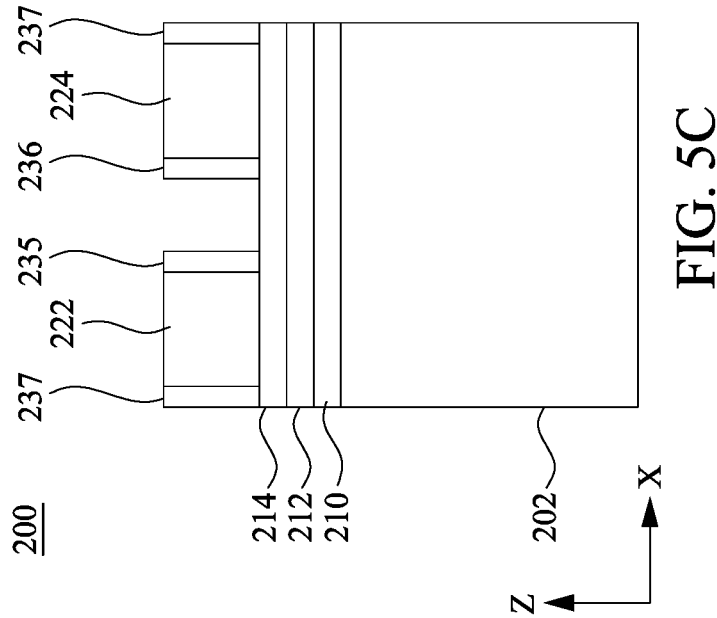
Figure 5B:
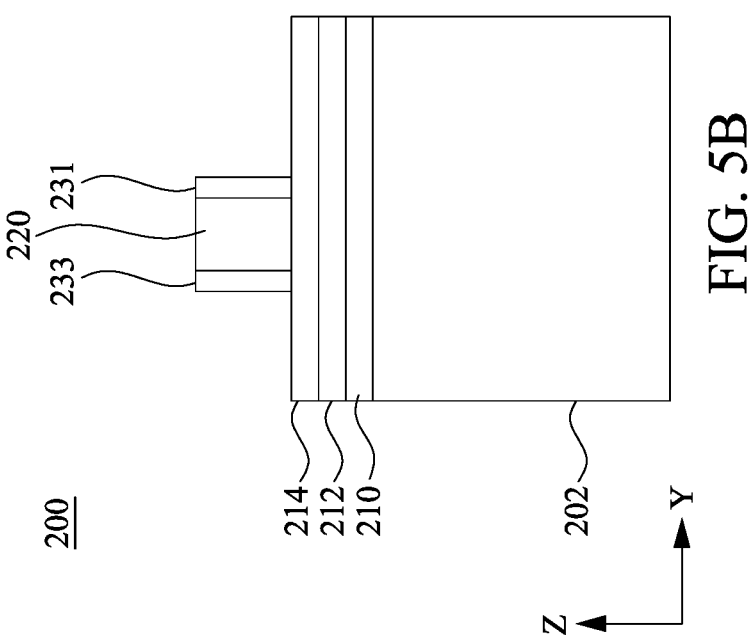

The resulting structure is shown in FIGS. 5A-5C. As illustrated here, there are four total spacers extending in the first axis, two spacers 231, 233 around mandrel portion 222, and two spacers 232, 234 around mandrel portion 224. There are two internal spacers 235, 236 extending in the second axis adjacent the mandrel trench 226. There are also two external spacers 237 extending in the second axis at the far ends of the mandrel opposite the mandrel trench. Referring to FIG. 5C, the width 227 of the mandrel trench is now narrower as it has been partially filled by the two internal spacers 235, 236, and in some embodiments is about 20 nm or greater, although other values and ranges are also within the scope of this disclosure.

Figure 6A:
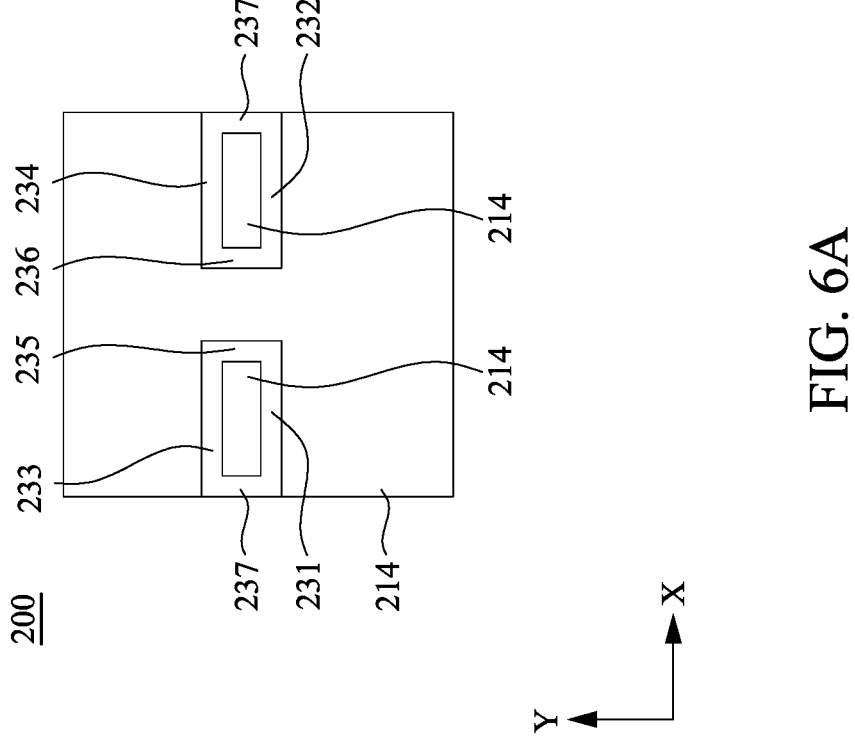
FIGS. 6A-6C are different views of a processing step.
Figure 6C:
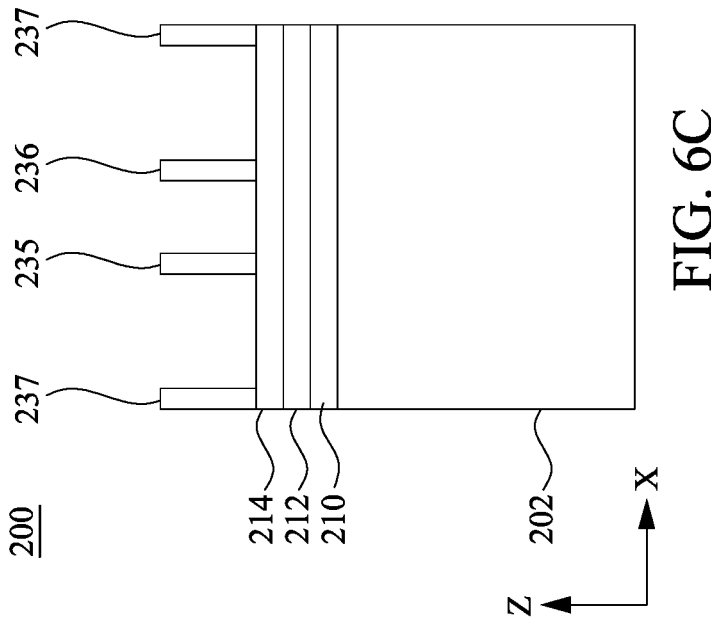
Figure 6B:
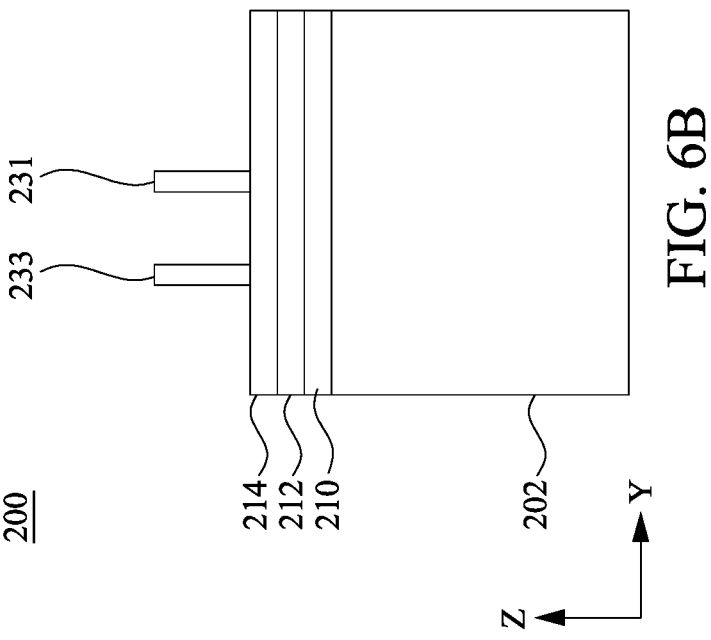

Next, in step 125 of FIG. 1, the mandrel is removed. The two mandrel portions may be removed, for example, by etching. The resulting structure is shown in FIGS. 6A-6C.

Then, in step 130, etching is performed to transfer the spacer pattern through the hardmask layers 204, 206, 208 into the substrate 202 and form fins. Appropriate and suitable etchants are used to etch through each layer. It is noted that due to the SADP process, the fin pitch is half that of the original mask pattern used to form the mandrel.

In step 135, the spacers are removed. The hardmask layers are also removed. The resulting structure is shown in FIGS. 7A-7C. As illustrated here, the structure may be described as being made up of four total fins extending in the first axis 206. A first fin 241 is in-line with a second fin 242 through their length. A third fin 243 is also in-line with a fourth fin 244 through their length. The first fin 241 and the third fin 243 are parallel to each other, and their ends are aligned with each other. The second fin 242 and the fourth fin 244 are parallel to each other, and their ends are aligned with each other. Using the mandrel trench 226 as a reference, the first fin 241 and the third fin 243 may be considered as being located in a first active region 252 on the substrate. Similarly, the second fin 242 and the fourth fin 244 may be considered as being located in a second active region 254 on the substrate.

Two internal fins 245, 246 extend in the second axis adjacent the mandrel trench 226. These internal fins may also be described as a set or plurality of fins extending in the second axis 208. There are also two external fins 247 extending in the second axis spaced apart from the mandrel trench. Fins 241, 243, 245 are located in the first active region 252. Fins 242, 244, 246 are located in the second active region 254.

Next, in optional step 137 as illustrated in FIGS. 8A-8C, a fin etch mask 260 is formed that exposes the third fin 243 and the fourth fin 244. The external fins 247 are desirably also exposed by the fin etch mask 260. In some embodiments, a portion of the internal fins 245, 246 may also be exposed (in either the X-axis or the Y-axis). It should be noted that the fins have a pitch which is half that possible from the mask pattern alone, and so the width of the exposed area is necessarily greater than that of the fins themselves. Etching is then performed to remove the third fin and the fourth fin, and potentially some portion of the internal fins. It is noted that although some portion of the substrate 202 is also exposed (see FIG. 8B), generally the third fin 243 and the fourth fin 244 will be etched more quickly than the substrate due to the greater exposed surface area of these fins (three sides of the fin are exposed) compared to the exposed surface area of the substrate.

After the fin etch mask is removed, the resulting structure is shown in FIGS. 9A-9C. This resulting structure can be described as including the first fin 241, second fin 242, and internal fins 245, 246 extending in the second axis. Due to process control limitations, it is not possible to always ensure the internal fins 245, 246 are completely etched away.

Next, referring to step 140 of FIG. 1 and FIGS. 10A-10C, a CPODE etch mask 262 is formed that exposes the substrate 202 between the fins 245, 246 extending in the second axis 208. As illustrated here, the internal fins 245, 246 are covered by the CPODE etch mask, but this is not required. The exposed area of the substrate corresponds to the same location as mandrel trench 226.

Referring now to step 145 of FIG. 1 and FIGS. 11A-11C, etching is performed into the substrate through the CPODE etch mask to form a trench 270 in the substrate.

Then, as seen in step 150 of FIG. 1 and FIGS. 12A-12C, the trench 270 is filled with a dielectric material to form a dielectric structure or dielectric isolation region 256 between the first active region 252 and the second active region 254. The dielectric material is commonly a silicon oxide, although other dielectric materials can also be used such as undoped polysilicon, silicon nitride, silicon oxynitride, fluoride-doped silicate glass, or other dielectric material. The deposition can be done using physical vapor deposition (PVD) or chemical vapor deposition (CVD) or spin-on processes known in the art. This dielectric structure may also be referred to as a CPODE structure.

Referring to FIGS. 12A-12C, it should be noted that the trench is filled with dielectric material up to at least the fin height 248. Put another way, the dielectric structure has a minimum total height 257 that is equivalent to the sum of the depth 271 of the trench into the substrate and the height 248 of the fin.

In step 155 of FIG. 1, the CPODE etch mask is removed. The final resulting structure is shown in FIGS. 13A-13C. A dielectric structure or dielectric isolation region 256 is located between the first active region 252 and the second active region 254. Each active region 252, 254 can be described as containing a fin 280, 282 that is made up of a longer first portion 283 and a shorter second portion 285. The first portion 283 of each fin extends in the first axis, and the second portion 285 of each fin extends in the second axis. The longer first portion 283 of each fin 280, 282 are in-line with each other. The shorter second portion 285 of each fin 280, 282 are parallel to each other in the Y-axis, and their ends are aligned with each other. The second shorter portion 285 of each fin 280, 282 can also be described as paralleling or bordering the dielectric isolation region 256.

It is noted that as illustrated here, the dielectric material of the dielectric structure does not cover the shorter second portions 285 of the fins. However, other embodiments are contemplated where the dielectric material does cover the shorter second portions of the fins.

Some variations in this method are also described in FIG. 1. As indicated above the third fin 243 and the fourth fin 244 are removed in optional step 137 which is shown in FIGS. 8A-8C as occurring prior to forming the CPODE etch mask. However, if step 137 is not performed, the third fin 243 and fourth fin 244 could also be removed in optional step 157 after the trench is filled with dielectric material in step 150.

If step 137 is not performed, then the resulting structure after step 155 is shown in FIGS. 14A-14C. This is similar to the structure shown in FIGS. 7A-7C, but with the addition of the dielectric structure 256. Four fins 241, 242, 243, 244 extend in the first axis 206. A pair of internal fins 245, 246 and external fins 247 extend in the second axis 208.

As described in step 157 of FIG. 1 and shown in FIGS. 15A-15C, a fin etch mask 260 is formed that exposes the third fin 243 and the fourth fin 244. Again, the external fins 247 are desirably also exposed by the fin etch mask 260, and a portion of the internal fins 245, 246 may also be exposed. The third fin 243 and the fourth fin 244 are then etched away. After the fin etch mask is removed, the final structure is the same as shown in FIGS. 13A-13C.

In another variation, rather than etching away the third fin and the fourth fin, the spacers used to form these fins are etched away. This is indicated in optional step 127, and begins after the mandrel is removed, as discussed in step 125 of FIG. 1 and illustrated in FIGS. 6A-6B.

Figure 16A:
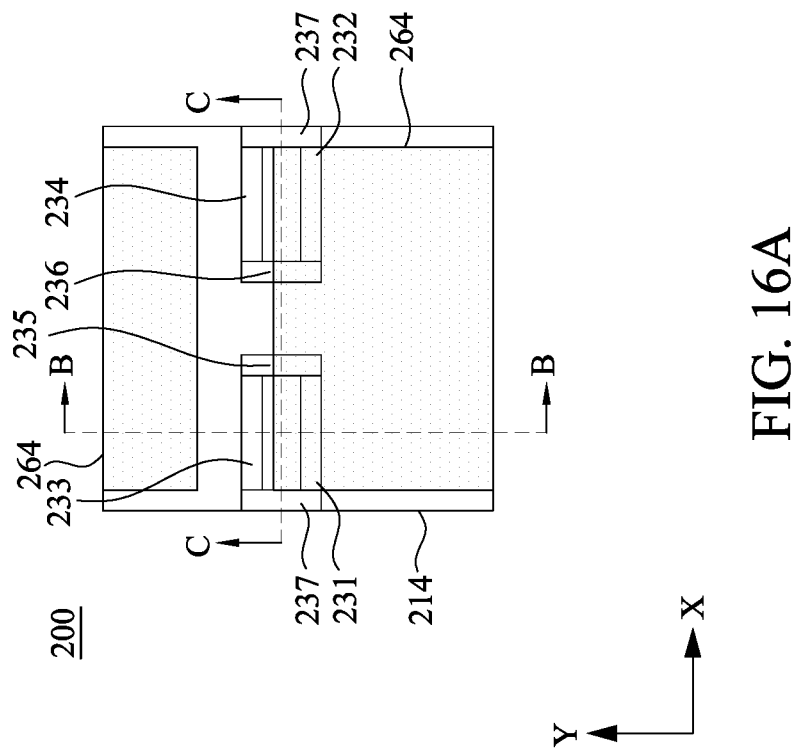
FIGS. 16A-16C are different views of a processing step in a second variation of the methods of FIG. 1.
Figure 16C:
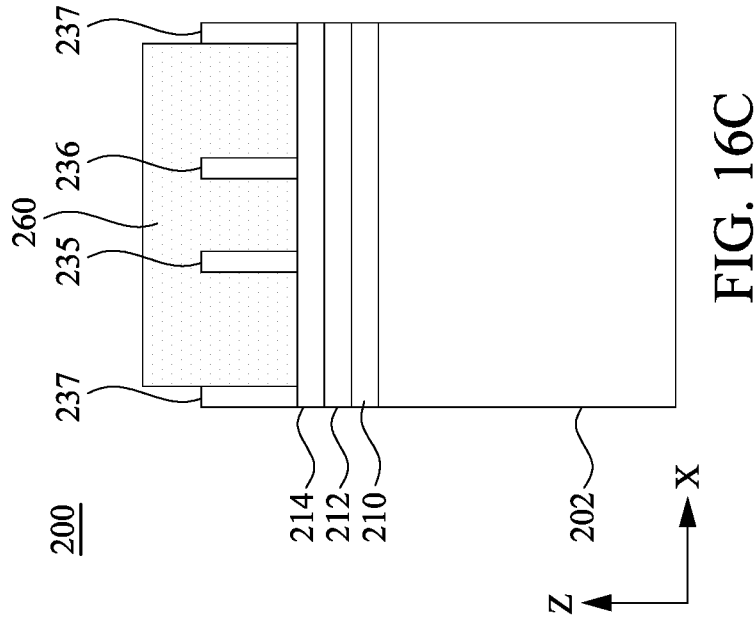
Figure 16B:
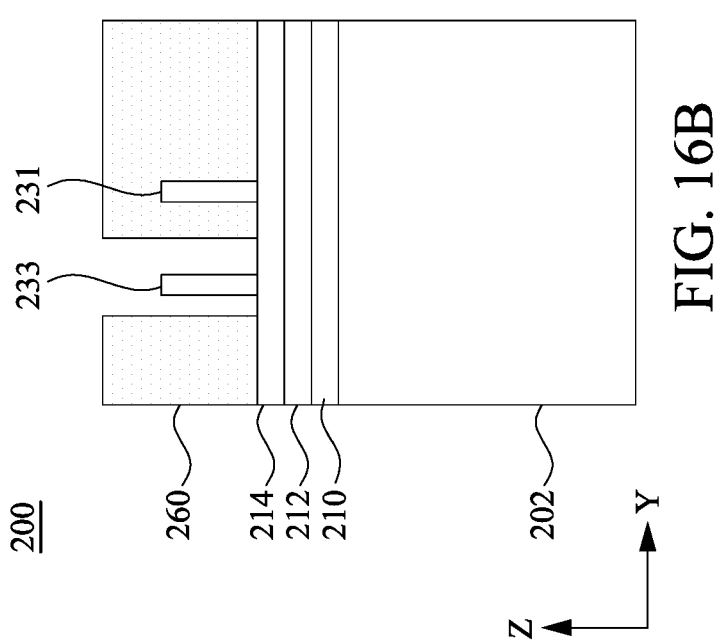

Referring now to FIGS. 16A-16C, there are four spacers 231, 232, 233, 234 extending in the first axis. There are two internal spacers 235, 236 extending in the second axis adjacent the mandrel trench 226. There are also two external spacers 237 extending in the second axis at the far ends of the mandrel opposite the mandrel trench. Referring concurrently to FIGS. 7A-7C, spacer 233 would eventually form third fin 243, spacer 234 would eventually form fourth fin 244, the external spacers 237 would eventually form the external fins 247, and the internal spacers 235, 236 would eventually form the internal fins 245, 246. A spacer etch mask 264 is formed that exposes spacers 233, 234 which are formed on one sidewall of the mandrel. Desirably, the spacer etch mask also exposes the external spacers 237. A portion of the internal spacers 235, 236 may also be exposed. The exposed spacers are then etched away. After the fin etch mask is removed, the resulting structure is shown in FIGS. 17A-17C. After the remaining process steps are performed, the final structure will again be the same as shown in FIGS. 13A-13C.

It is noted that although steps 127, 137, and 157 are individually identified as being optional steps in FIG. 1, at least one of these steps must be performed to remove the third fin and the fourth fin.

It is also possible to completely etch away the internal fins 245, 246 that extend in the second axis. This could be done, for example, during any of the optional etching steps 127, 137, or 157, by appropriate patterning of the fin etch layer.

Alternatively, the internal fins 245, 246 could also be completely etched away during steps 140, 145, and 150 when the dielectric structure is formed. Such a variation is illustrated beginning in FIGS. 18A-18C. As seen here, the internal fins 245, 246 are exposed by the CPODE etch mask 262, along with the substrate between them. FIGS. 19A-19C illustrate the resulting structure after etching step 145. It is noted that due to the etching away of the internal fins, the trench 270 may be deeper near its center compared to the areas where the internal fins were previously located.

FIGS. 20A-20C illustrate the resulting structure after the dielectric material has been applied. The dielectric isolation region 256 separates the first active region 252 and the second active region 254.

FIGS. 21A-21C illustrate the final structure, in some embodiments. Here, the resulting fins 280, 282 extend only in the first axis 206, and no longer have any portion that extends in the second axis 208.

The CPODE structure is conventionally formed in one etching step, where continuous etching is performed through the fin and down into the substrate. The methods of FIG. 1 result in the location for the dielectric structure being etched in two different steps. The first etching step of the mandrel results in the fin not being formed at all, and is thus equivalent to etching through the fin. The second etching step occurs when the substrate is etched. As a result, the depth/width ratio of each separate etching step is significantly less, resulting in better process control and higher dielectric isolation. This permits the critical dimension (CD) width to be increased, in some instances by as much as twenty (20) nanometers (nm). The etching process window is also enlarged, as is the overlay window for small fin end-to-end spaces. Fin end-to-end losses are also reduced.

Figure 22:
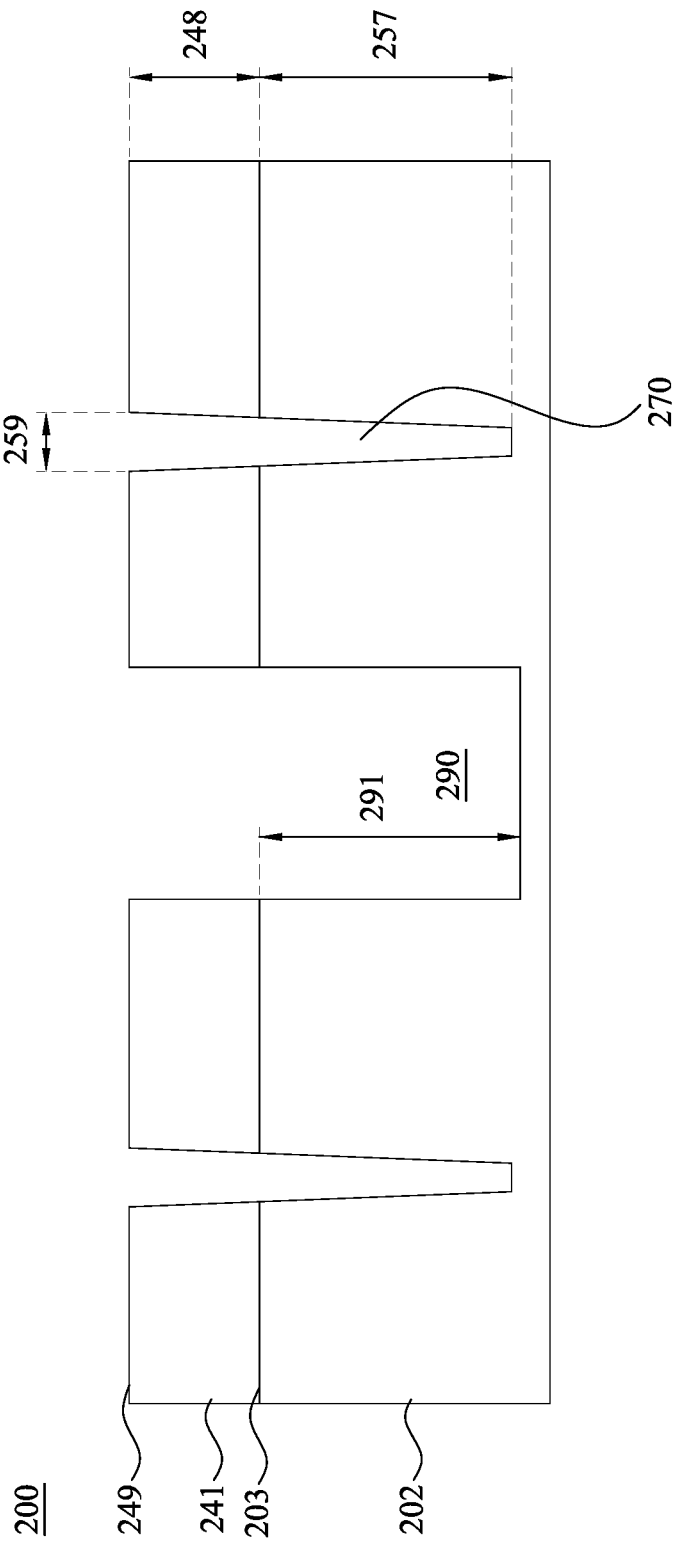
FIG. 22 is a cross-sectional view through the substrate to illustrate additional aspects of the dielectric structure, in some embodiments.

The methods of the present disclosure also permit the depth of the CPODE structure to be adjusted as desired through a combination of greater step etching rate control and Ultra-More-Etch (UME) depth. In addition, the depth of the overall CPODE structure can also be increased by about 10% to about 20%. This is illustrated in the example cross-sectional view of the integrated circuit 200 illustrated in FIG. 22. The CPODE trench 270 is shown here along with a shallow trench isolation (STI) region 290. The width 259 of the CPODE trench is, in some embodiments, from about 20 nm to about 30 nm, although other values and ranges are also within the scope of this disclosure. The STI region has a depth 291, which is measured from the surface 203 of the substrate 202 and into the substrate. The fin height 248 is also measured from the surface 203 of the substrate to the top 249 of the fin 241. In some embodiments, the fin height 248 can range from about 250 angstroms to about 600 angstroms, including from about 400 angstroms to about 500 angstroms, although other values and ranges are also within the scope of this disclosure. The CPODE depth 257 is measured from the top 249 of the fin to the bottom of the trench 270. In the methods of the present disclosure, the CPODE depth can be from about 1100 angstroms to about 1300 angstroms, although other values and ranges are also within the scope of this disclosure. This depth is about equal to the sum of the STI depth 291 and the fin height 248. When the CPODE structure is etched in one step, the CPODE depth is usually a minimum of 100 angstroms less than the sum of the STI depth and the fin height. This ability to increase the depth of the CPODE structure using the methods of the present disclosure also improves the electrical isolation between the two active regions on either side of the CPODE structure.

Figure 23A:
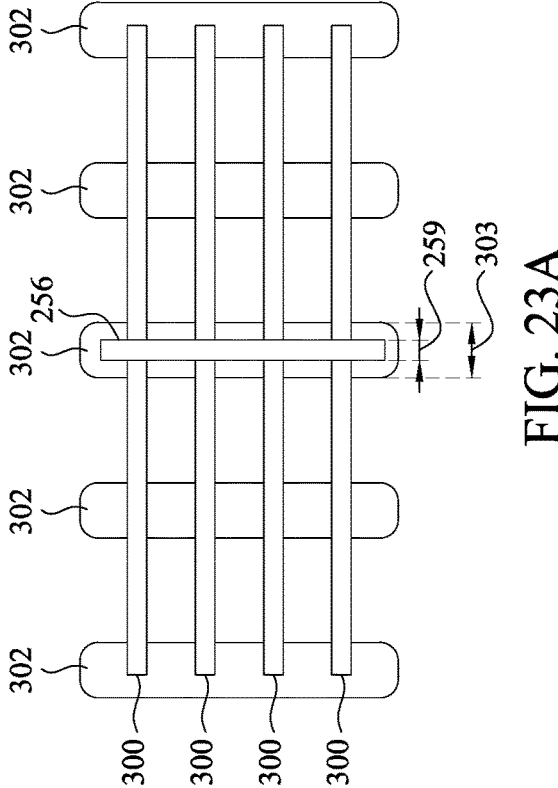
FIG. 23A is a plan-view illustration of a CPODE structure prepared in one etching step, for comparative purposes.
Figure 23B:
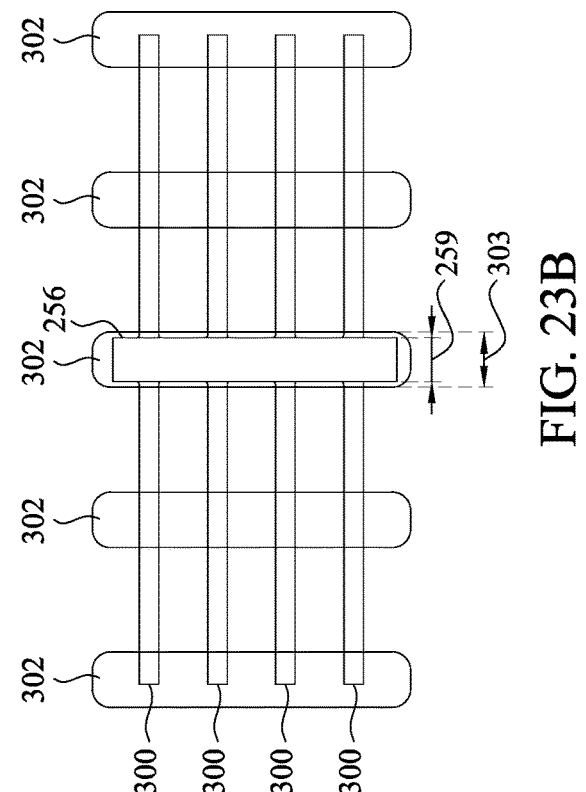
FIG. 23B is a plan-view illustration of a CPODE structure prepared according to some embodiments of the methods of the present disclosure.

FIG. 23A and FIG. 23B illustrate generally the improvement in the CPODE structure that can be obtained due to the methods of the present disclosure. FIG. 23A is a plan-view illustration showing the CPODE structure obtained by one etching step. In conventional processes, a polysilicon region is used as a dummy gate layer. The dummy gate is removed, a trench is etched through the fin and the substrate in one step, and the CPODE structure is produced by filling the etched trench and dummy gate region with the dielectric material. Whereas prior figures depicted only one fin and one CPODE structure, in this illustration, four continuous fins 300 are shown extending left-to-right. Five polysilicon regions 302 are shown running top-to-bottom. Within the center polysilicon region is a CPODE structure 256. The width 259 of the CPODE structure is less than the width 303 of the polysilicon region, and is approximately half the width of the polysilicon region.

FIG. 23B is a plan-view illustration showing one example of the increase in the width of the CPODE structure that can be obtained using the methods of the present disclosure. Here, the fins 300 are illustrated as being cut in half along their length, as would occur in the methods of the present disclosure. The width 259 of the CPODE structure is much larger, and is almost equal to the width 303 of the polysilicon region.

The substrate with the CPODE structure may be further processed to obtain the desired integrated circuit. In addition, processing steps to form other structures on the substrate were omitted from the discussion above. For example, STI regions may have been formed between the fins before the hardmask layers were removed between FIGS. 6A-6C and FIGS. 7A-7C. Additional processing steps that may occur after the CPODE structure is formed in FIGS. 13A-13C may include various doping, lithography, etching, and deposition steps for forming source/drain regions, dummy gates or metal gates, interlayer dielectric (ILD) regions, etch stop layers, gate oxide layers, etc. needed in transistors or other semiconductor devices.

Some embodiments of the present disclosure thus relate to methods for forming a dielectric structure between a first active region and a second active region. A mandrel is formed that extends in a first axis over a substrate. Etching is performed to form a trench in the mandrel in a second axis normal to the first axis in a desired location for the dielectric structure. Spacers are formed on sidewalls of the mandrel. The mandrel is then removed. Etching into the substrate is done to form at least a first fin located in the first active region that extends in the first axis, a second fin located in the second active region that extends in the first axis, and a plurality of fins extending in the second axis. The spacers are then removed. A CPODE etch mask is formed that exposes the substrate between the plurality of fins extending in the second axis. Etching into the substrate through the CPODE etch mask is done to form a trench. The trench is then filled with a dielectric material up to at least a fin height, to form the dielectric structure between the first active region and the second active region.

The present disclosure also relates to integrated circuits comprising a substrate having a first active region and a second active region separated by a dielectric isolation region. A first fin is present in the first active region that comprises a longer first portion normal to the dielectric isolation region and a shorter second portion that parallels the dielectric isolation region. A second fin is present in the second active region that comprises a longer first portion normal to the dielectric isolation region and a shorter second portion that parallels the dielectric isolation region. The longer first portion of the first fin and the longer first portion of the second fin are in-line with each other. The shorter second portion of the first fin and the shorter second portion of the second fin are parallel to each other.

Other embodiments of the present disclosure also relate to methods for forming a first active region and a second active region. A mandrel is formed over a substrate. Etching is performed to form a trench in the mandrel. Etching into the substrate is then done to form a first fin and a third fin located in the first active region, a second fin and a fourth fin located in the second active region, and a plurality of shorter fins separating the first active region and the second active region. A fin etch mask is formed that exposes the third fin and the fourth fin. Etching is performed to remove the third fin and the fourth fin. A CPODE etch mask is formed that exposes the substrate between the plurality of shorter fins. Etching into the substrate through the CPODE etch mask is done to form a trench. The trench is then filled with a dielectric material to form an isolation region between the first active region and the second active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a dielectric structure between a first active region and a second active region, comprising:
   forming a mandrel extending in a first axis over a substrate;
   etching to form a trench in the mandrel in a second axis normal to the first axis in a desired location for the dielectric structure;
   forming spacers on sidewalls of the mandrel;
   removing the mandrel;
   etching into the substrate to form at least a first fin located in the first active region that extends in the first axis, a second fin located in the second active region that extends in the first axis, and a plurality of fins extending in the second axis;
   removing the spacers;
   forming a CPODE etch mask that exposes the substrate between the plurality of fins extending in the second axis; and
   etching into the substrate through the CPODE etch mask to form a trench;
   filling the trench with a dielectric material up to at least a fin height, to form the dielectric structure between the first active region and the second active region.

2. The method of claim 1, wherein the etching into the substrate also forms a third fin in the first active region that extends in the first axis and a fourth fin in the second active region that extends in the first axis, and wherein the method further comprises:
   forming a fin etch mask that exposes the third fin and the fourth fin; and
   etching to remove the third fin and the fourth fin.

3. The method of claim 2, wherein the third fin and the fourth fin are removed prior to forming the CPODE etch mask, or after filling the trench with the dielectric material.

4. The method of claim 2, wherein a portion of the plurality of fins extending in the second axis are also removed during the etching to remove the third fin and the fourth fin.

5. The method of claim 1, further comprising, prior to removing the mandrel:
   forming a spacer etch mask that exposes at least one spacer formed on one sidewall of the mandrel extending in the first axis; and
   etching to remove the exposed at least one spacer.

6. The method of claim 1, wherein the CPODE etch mask also exposes at least a portion of a fin extending in the second axis.

7. The method of claim 1, wherein the plurality of shorter fins extending in the second axis are not covered by the dielectric material that forms the dielectric structure.

8. The method of claim 1, wherein the dielectric structure has a depth of about 1100 angstroms to about 1300 angstroms.

9. The method of claim 1, wherein the dielectric structure has a width of about 150 angstroms to about 400 angstroms.

10. A method for forming a first active region and a second active region, comprising:
    forming a mandrel over a substrate;
    etching to form a trench in the mandrel;
    etching into the substrate to form a first fin and a third fin located in the first active region, a second fin and a fourth fin located in the second active region, and a plurality of fins separating the first active region and the second active region;
    forming a fin etch mask that exposes the third fin and the fourth fin;
    etching to remove the third fin and the fourth fin;
    forming a CPODE etch mask that exposes the substrate between the plurality of fins separating the first active region and the second active region;
    etching into the substrate through the CPODE etch mask to form a trench; and
    filling the trench with a dielectric material to form an isolation region between the first active region and the second active region.

11. The method of claim 10, wherein the third fin and the fourth fin are removed prior to forming the CPODE etch mask, or after filling the trench with the dielectric material.

12. The method of claim 10, wherein a portion of the plurality of fins separating the first active region and the second active region are also removed during the etching to remove the third fin and the fourth fin.

13. The method of claim 10, wherein the CPODE etch mask also exposes at least a portion of a fin in the plurality of fins separating the first active region and the second active region.

14. The method of claim 10, wherein the plurality of fins separating the first active region and the second active region are not covered by the dielectric material that forms the isolation region.

15. The method of claim 10, wherein a plurality of hardmask layers are located between the substrate and the mandrel.

16. The method of claim 10, wherein the isolation region has a depth of about 1100 angstroms to about 1300 angstroms.

17. The method of claim 10, wherein the isolation region has a width of about 20 nanometers to about 30 nanometers.

18. A method for forming a dielectric structure between a first active region and a second active region, comprising:

forming a mandrel over a substrate;

etching to form a trench in the mandrel;

etching into the substrate to form at least a first fin located in the first active region that extends in a first axis, a second fin located in the second active region that extends in the first axis, and a plurality of fins extending in a second axis;

forming a CPODE etch mask that exposes the substrate between the plurality of fins extending in the second axis; and etching into the substrate through the CPODE etch mask to form a trench;

filling the trench with a dielectric material to form the dielectric structure between the first active region and the second active region.

19. The method of claim 18, wherein the etching into the substrate also forms a third fin in the first active region that extends in the first axis and a fourth fin in the second active region that extends in the first axis, and wherein the method further comprises:

forming a fin etch mask that exposes the third fin and the fourth fin; and etching to remove the third fin and the fourth fin.

20. The method of claim 18, further comprising, prior to removing the mandrel:

forming a spacer etch mask that exposes at least one spacer formed on one sidewall of the mandrel extending in the first axis; and etching to remove the exposed at least one spacer.

\* \* \* \* \*